United States Patent
Lee et al.

(10) Patent No.: US 10,726,885 B1
(45) Date of Patent: Jul. 28, 2020

(54) SEMICONDUCTOR SYSTEMS

(71) Applicant: SK hynix Inc., Icheon-si Gyeonggi-do (KR)

(72) Inventors: Yoo Jong Lee, Suwon-si Gyeonggi-do (KR); Kang Sub Kwak, Seoul (KR); Young Jun Yoon, Hwaseong-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/534,115

(22) Filed: Aug. 7, 2019

(30) Foreign Application Priority Data

Jan. 8, 2019  (KR) .................. 10-2019-0002383

(51) Int. Cl.
*G11C 7/00* (2006.01)
*G11C 7/10* (2006.01)
*H04L 25/02* (2006.01)
*G06F 13/368* (2006.01)

(52) U.S. Cl.
CPC .......... *G11C 7/1048* (2013.01); *G06F 13/368* (2013.01); *G11C 7/1078* (2013.01); *H04L 25/0298* (2013.01)

(58) Field of Classification Search
CPC ............ G11C 13/0069; G11C 11/4074; G11C 11/419; G11C 13/004; G11C 8/08; G11C 16/10; G11C 13/0026
See application file for complete search history.

(56) References Cited

U.S. PATENT DOCUMENTS

| | | | | |
|---|---|---|---|---|
| 9,830,990 B2 * | 11/2017 | Izumi | ................... | G11C 11/2259 |
| 10,025,517 B2 * | 7/2018 | Kim | ..................... | G06F 3/0659 |
| 10,438,657 B2 * | 10/2019 | Parkinson | ........... | G11C 11/1659 |
| 10,607,701 B2 * | 3/2020 | Higashi | .................. | G11C 11/223 |
| 2010/0182817 A1 * | 7/2010 | Koshizuka | ............... | G11C 8/04 365/51 |
| 2017/0351451 A1 | 12/2017 | Gans | | |
| 2020/0042207 A1 * | 2/2020 | Kwak | ................... | G06F 3/0625 |

FOREIGN PATENT DOCUMENTS

KR   1020180029347 A   3/2018

* cited by examiner

*Primary Examiner* — Hien N Nguyen
(74) *Attorney, Agent, or Firm* — William Park & Associates Ltd.

(57) ABSTRACT

A semiconductor system includes a controller and a semiconductor device. The controller outputs a clock signal, a chip selection signal and a command/address signal. The controller includes a controller termination circuit turned on during a read operation. The controller receives first data through an input/output (I/O) line coupled to the controller termination circuit during the read operation and outputs second data through the I/O line coupled to the controller termination circuit turned off during a write operation. The semiconductor device includes an internal termination circuit turned off during the read operation, outputs the first data through the I/O line coupled to the internal termination circuit based on the chip selection signal and the command/address signal during the read operation, and stores the second data inputted through the I/O line coupled to the internal termination circuit turned on during the write operation.

29 Claims, 13 Drawing Sheets

FIG. 3

| OPERATION | CLK EDGE | CS | CA<1> | CA<2> | CA<3> | CA<4> | CA<5> | CA<6> | CA<7> |
|---|---|---|---|---|---|---|---|---|---|
| MRW1 | Rising | H | L | L | L | H | H | L | H |
| MRW2 | Rising | H | L | L | L | H | L | L | X |
| MRR | Rising | H | L | L | L | H | H | L | L |
| WRITE | Rising | H | L | L | H | X | X | X | X |
| READ | Rising | H | H | L | L | X | X | X | X |

SEMICONDUCTOR SYSTEMS

CROSS-REFERENCE TO RELATED APPLICATIONS

The present application claims priority under 35 U.S.C 119(a) to Korean Application No. 10-2019-0002383, filed on Jan. 8, 2019, which is incorporated herein by reference in its entirety.

BACKGROUND

1. Technical Field

Embodiments of the present disclosure generally relate to semiconductor systems performing an on-die termination operation.

2. Related Art

As a swing width of transmission signals between semiconductor devices included in a fast semiconductor system is gradually reduced, reflection of the transmission signals has severely occurred at interface stages between the semiconductor devices due to impedance mismatch. The impedance mismatch may occur due to variation of process condition. Thus, an impedance matching circuit (also, referred to as "on-die termination (ODT) circuit") has been used in semiconductor systems to suppress the reflection of the transmission signals.

SUMMARY

According to an embodiment, a semiconductor system includes a controller and a semiconductor device. The controller configured to output a clock signal, a chip selection signal and a command/address signal. The controller includes a controller termination circuit configured to adjust a drivability of an input and output (I/O) line during a read operation. The controller configured to receive first data through an input/output (I/O) line coupled to the controller termination circuit during the read operation and outputs second data through the I/O line coupled to the controller termination circuit configured to not adjust a drivability of the I/O line during a write operation. The semiconductor device includes an internal termination circuit configured to inhibit the I/O line from being driven during the read operation. The semiconductor device configured to output the first data through the I/O line coupled to the internal termination circuit based on the chip selection signal and the command/address signal during the read operation. The semiconductor device configured to store the second data which is inputted through the I/O line coupled to the internal termination circuit configured to adjust a drivability of the I/O line during the write operation.

According to an embodiment, a semiconductor system includes a controller, a first semiconductor device and a second semiconductor device. The controller configured to output a clock signal, first and second chip selection signals and a command/address signal. The controller includes a controller termination circuit which is configured to adjust a drivability of an input and output (I/O) line during a read operation and turned off during a write operation. The first semiconductor device includes a first internal termination circuit which is configured to inhibit the I/O line from being driven during the read operation and the write operation based on the first chip selection signal and the command/ address signal. The second semiconductor device includes a second internal termination circuit which is configured to adjust a drivability of the I/O line during the read operation and the write operation based on the second chip selection signal and the command/address signal. The controller termination circuit, the first internal termination circuit and the second internal termination circuit share the input/output (I/O) line with each other.

BRIEF DESCRIPTION OF THE DRAWINGS

FIG. 3 is a table illustrating various logic level combinations of a chip selection signal and a command/address signal for operations of the semiconductor system shown in FIG. 1.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

The word "coupled," as used herein for some embodiments, means that two components are directly connected with one another. For example, a first component coupled to a second component means the first component is contacting the second component. For other embodiments, coupled components have one or more intervening components. For example, a first component is coupled to a second component when the first and second components are both in contact with a common third component even though the first component is not directly contacting the second component.

Figure 1:
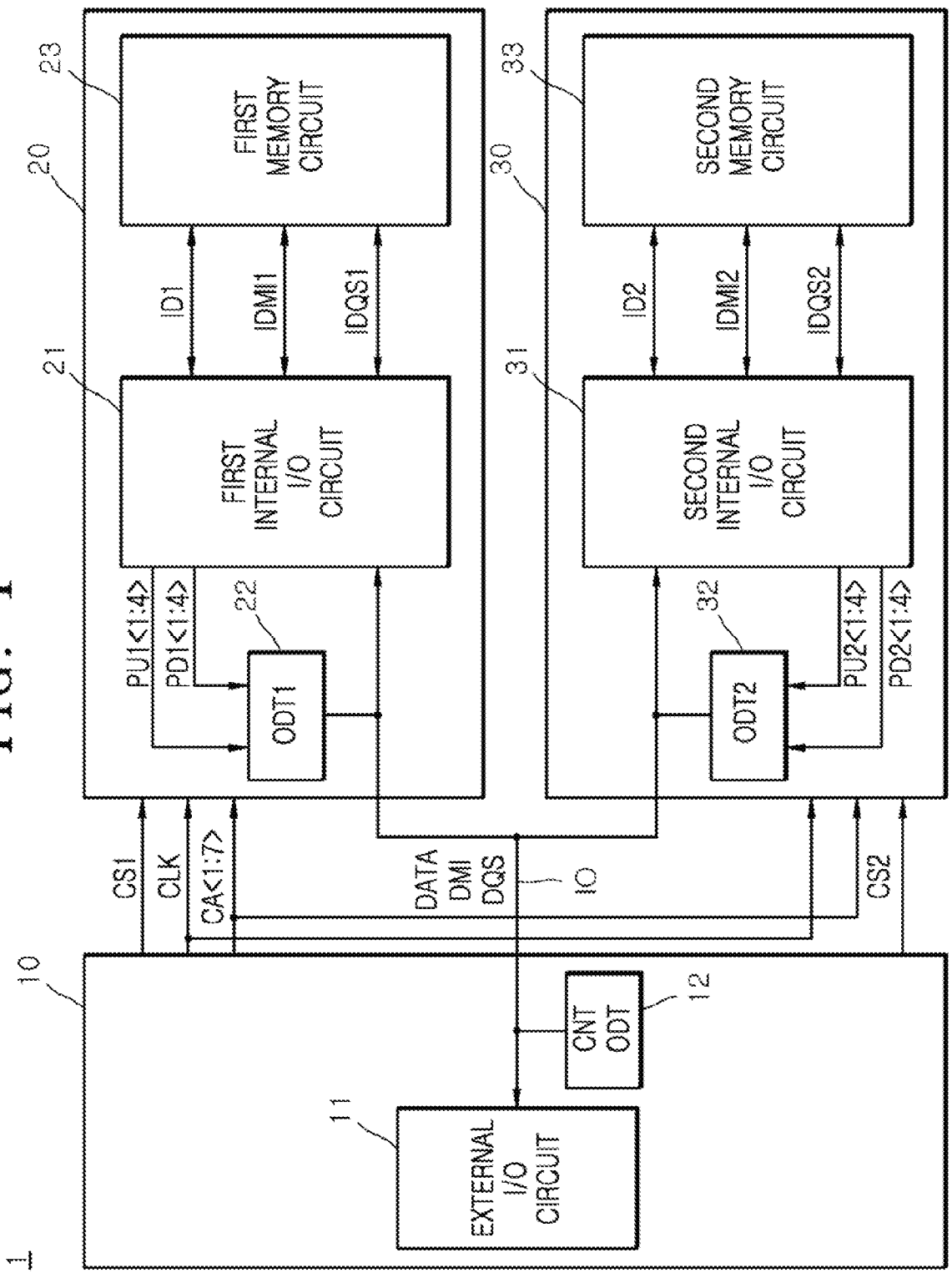
FIG. 1 is a block diagram illustrating a configuration of a semiconductor system according to an embodiment of the present disclosure.

As illustrated in FIG. 1, a semiconductor system 1 according to an embodiment may include a controller 10, a first semiconductor device 20 and a second semiconductor device 30.

The controller 10 may output a clock signal CLK, a first chip selection signal CS1, a second chip selection signal CS2, and first to seventh command/address signals CA<1:7>. The controller 10 may output data DATA during a write operation and may receive the data DATA during a read operation. The controller 10 may output a data processing signal DMI during the write operation and may receive the data processing signal DMI during the read operation. The controller 10 may output a strobe signal DQS during the write operation and may receive the strobe signal DQS during the read operation. The data DATA may be inputted to or outputted from the first semiconductor device 20 and the second semiconductor device 30. The data processing signal DMI may be a signal for performing a masking operation and a data bus inversion operation of the data DATA which are inputted to or outputted from the first semiconductor device 20 and the second semiconductor device 30. The strobe signal DQS may be a signal for strobing the data DATA which are inputted to or outputted from the first semiconductor device 20 and the second semiconductor device 30. Although the data DATA, the data processing signal DMI and the strobe signal DQS are illustrated as a single signal in FIG. 1, each of the data DATA, the data processing signal DMI and the strobe signal DQS may be set to include a plurality of bits in some embodiments.

The controller 10 may include an external input/output (I/O) circuit 11 and a controller termination circuit (CNTODT) 12. The external I/O circuit 11 may output the data DATA, the data processing signal DMI and the strobe signal DQS during the write operation. The external I/O circuit 11 may receive the data DATA, the data processing signal DMI and the strobe signal DQS during the read operation. The controller termination circuit 12 may be turned on during the read operation. The controller termination circuit 12 may adjust a drivability thereof according to a resistance value of an I/O line IO through which the data DATA, the data processing signal DMI and the strobe signal DQS are transmitted, thereby driving the I/O line IO during the read operation. When the controller termination circuit 12 may be turned on, the controller termination circuit 12 may adjust a drivability of the I/O line 10. The controller termination circuit 12 may be turned off during the write operation. When the controller termination circuit 12 may be turned off, the controller termination circuit 12 may not adjust a drivability of the I/O line IO. Although the I/O line IO is illustrated as a single line in FIG. 1, the I/O line IO may include a plurality of lines.

While the read operation is performed, the controller termination circuit 12 is turned on and the controller 10 may receive the data DATA, the data processing signal DMI and the strobe signal DQS through the I/O line 10. While the write operation is performed, the controller termination circuit 12 may be turned off and the controller 10 may output the data DATA, the data processing signal DMI and the strobe signal DQS through the I/O line 10.

The first semiconductor device 20 may include a first internal I/O circuit 21, a first internal termination circuit (ODT1) 22 and a first memory circuit 23.

The first internal I/O circuit 21 may receive the data DATA according to the first chip selection signal CS1 and the first to seventh command/address signals CA<1:7> in synchronization with the clock signal CLK to generate first internal data ID1 during the write operation. The first internal I/O circuit 21 may generate the data DATA from the first internal data ID1 according to the first chip selection signal CS1 and the first to seventh command/address signals CA<1:7> in synchronization with the clock signal CLK during the read operation. The first internal I/O circuit 21 may receive the data processing signal DMI according to the first chip selection signal CS1 and the first to seventh command/address signals CA<1:7> in synchronization with the clock signal CLK to generate a first internal data processing signal IDMI1 during the write operation. The first internal I/O circuit 21 may generate the data processing signal DMI from the first internal data processing signal IDMI1 according to the first chip selection signal CS1 and the first to seventh command/address signals CA<1:7> in synchronization with the clock signal CLK during the read operation. The first internal I/O circuit 21 may receive the strobe signal DQS according to the first chip selection signal CS1 and the first to seventh command/address signals CA<1:7> in synchronization with the clock signal CLK to generate a first internal strobe signal IDQS1 during the write operation. The first internal I/O circuit 21 may generate the strobe signal DQS from the first internal strobe signal IDQS1 according to the first chip selection signal CS1 and the first to seventh command/address signals CA<1:7> in synchronization with the clock signal CLK during the read operation. The first internal I/O circuit 21 may be synchronized with the clock signal CLK to generate a first pull-up drive signal PU1<1:4> and a first pull-down drive signal PD1<1:4> for adjusting a drivability for driving the I/O line IO according to the first chip selection signal CS1 and the first to seventh command/address signals CA<1:7> during the read operation. The first internal I/O circuit 21 may generate the first pull-up drive signal PU1<1:4> and the first pull-down drive signal PD1<1:4> for setting a predetermined drivability if the second semiconductor device 30 performs the write operation or the read operation. The word "predetermined" as used herein with respect to a parameter, such as a predetermined drivability, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The first internal termination circuit 22 may drive the I/O line IO with a drivability which is adjusted according to the first pull-up drive signal PU1<1:4> and the first pull-down drive signal PD1<1:4> during the write operation. The first internal termination circuit 22 may be turned off during the read operation to inhibit the I/O line IO from being driven. The first internal termination circuit 22 may be turned on to drive the I/O line IO with a predetermined drivability which is adjusted according to the first pull-up drive signal PU1<1:4> and the first pull-down drive signal PD1<1:4> if the second semiconductor device 30 performs the write operation or the read operation. When the first internal termination circuit 22 may be turned on, the first internal termination circuit 22 may adjust a drivability of the I/O line IO. When the first internal termination circuit 22 may be turned off, the first internal termination circuit 22 may not adjust a drivability of the I/O line IO.

The first memory circuit 23 may store the first internal data ID1 during the write operation and may output the first internal data ID1 stored therein during the read operation. The first memory circuit 23 may store the first internal data processing signal IDMI1 during the write operation and may output the first internal data processing signal IDMI1 stored therein during the read operation. The first memory circuit 23 may store the first internal strobe signal IDQS1 during the write operation and may output the first internal strobe signal IDQS1 stored therein during the read operation.

The second semiconductor device 30 may include a second internal I/O circuit 31, a second internal termination circuit (ODT2) 32 and a second memory circuit 33.

The second internal I/O circuit 31 may receive the data DATA according to the second chip selection signal CS2 and the first to seventh command/address signals CA<1:7> in synchronization with the clock signal CLK to generate second internal data ID2 during the write operation. The second internal I/O circuit 31 may generate the data DATA from the second internal data ID2 according to the second chip selection signal CS2 and the first to seventh command/address signals CA<1:7> in synchronization with the clock signal CLK during the read operation. The second internal I/O circuit 31 may receive the data processing signal DMI according to the second chip selection signal CS2 and the first to seventh command/address signals CA<1:7> in synchronization with the clock signal CLK to generate a second internal data processing signal IDMI2 during the write operation. The second internal I/O circuit 31 may generate the data processing signal DMI from the second internal data processing signal IDMI2 according to the second chip selection signal CS2 and the first to seventh command/address signals CA<1:7> in synchronization with the clock signal CLK during the read operation. The second internal I/O circuit 31 may receive the strobe signal DQS according to the second chip selection signal CS2 and the first to seventh command/address signals CA<1:7> in synchronization with the clock signal CLK to generate a second internal strobe signal IDQS2 during the write operation. The second internal I/O circuit 31 may generate the strobe signal DQS from the second internal strobe signal IDQS2 according to the second chip selection signal CS2 and the first to seventh command/address signals CA<1:7> in synchronization with the clock signal CLK during the read operation. The second internal I/O circuit 31 may be synchronized with the clock signal CLK to generate a second pull-up drive signal PU2<1:4> and a second pull-down drive signal PD2<1:4> for adjusting a drivability for driving the I/O line IO according to the second chip selection signal CS2 and the first to seventh command/address signals CA<1:7> during the read operation. The second internal I/O circuit 31 may generate the second pull-up drive signal PU2<1:4> and the second pull-down drive signal PD2<1:4> for setting a pre-determined drivability if the first semiconductor device 20 performs the write operation or the read operation.

The second internal termination circuit 32 may drive the I/O line IO with a drivability which is adjusted according to the second pull-up drive signal PU2<1:4> and the second pull-down drive signal PD2<1:4> during the write operation. The second internal termination circuit 32 may be turned off during the read operation to inhibit the I/O line IO from being driven. The second internal termination circuit 32 may be turned on to drive the I/O line IO with a predetermined drivability which is adjusted according to the second pull-up drive signal PU2<1:4> and the second pull-down drive signal PD2<1:4> if the first semiconductor device 20 performs the write operation or the read operation. When the second internal termination circuit 32 may be turned on, the second internal termination circuit 32 may adjust a drivability of the I/O line IO. When the second internal termination circuit 32 may be turned off, the second internal termination circuit 32 may not adjust a drivability of the I/O line IO.

The second memory circuit 33 may store the second internal data ID2 during the write operation and may output the second internal data ID2 stored therein during the read operation. The second memory circuit 33 may store the second internal data processing signal IDMI2 during the write operation and may output the second internal data processing signal IDMI2 stored therein during the read operation. The second memory circuit 33 may store the second internal strobe signal IDQS2 during the write operation and may output the second internal strobe signal IDQS2 stored therein during the read operation.

Figure 2:
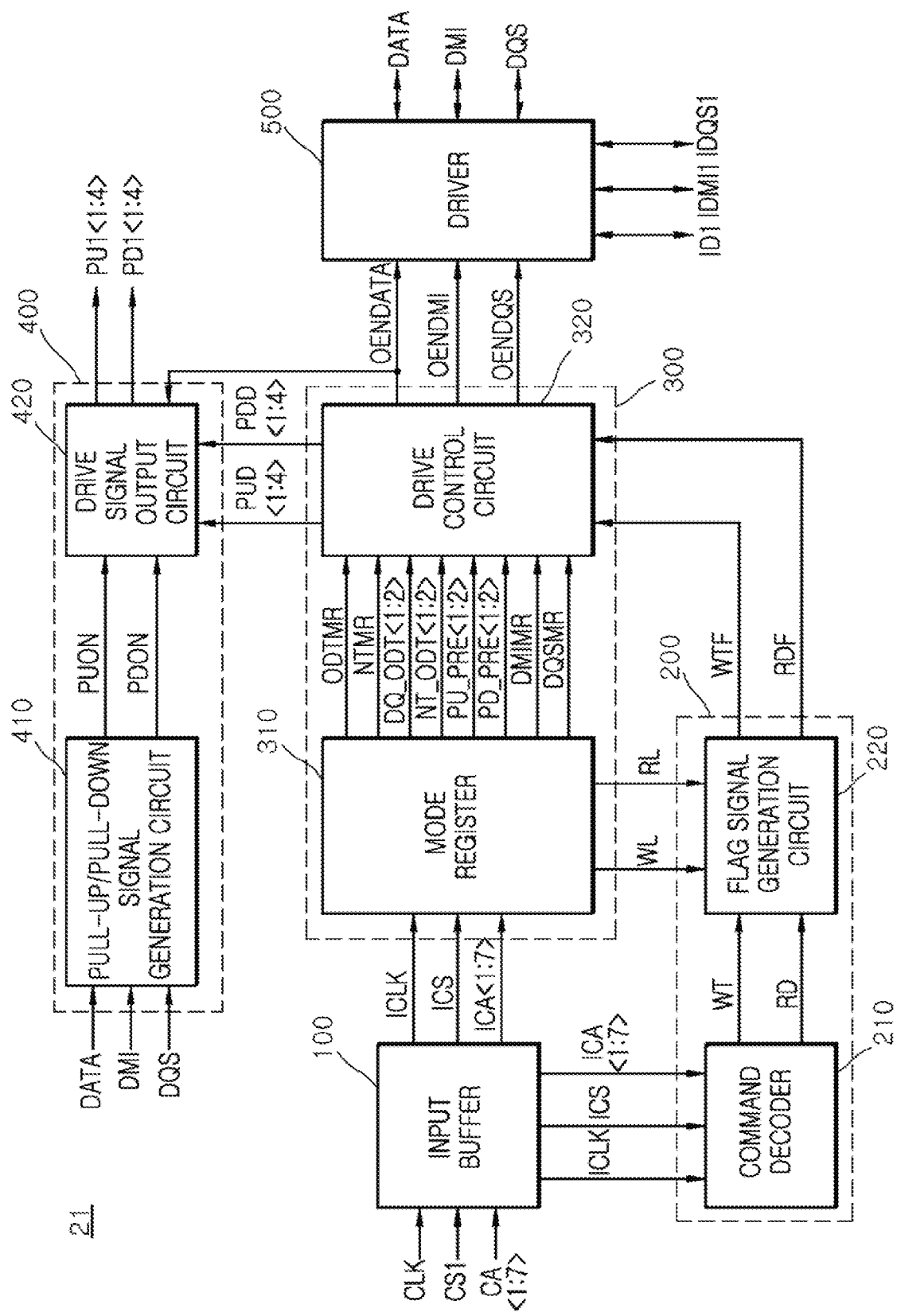
FIG. 2 is a block diagram illustrating a configuration of a first internal input/output (I/O) circuit included in the semiconductor system of FIG. 1.

Referring to FIG. 2, the first internal I/O circuit 21 may include an input buffer 100, a pulse generation circuit 200, an I/O control circuit 300, a drive signal generation circuit 400 and a driver 500.

The input buffer 100 may be synchronized with a rising edge of the clock signal CLK to generate an internal clock signal ICLK. The input buffer 100 may be synchronized with a rising edge of the clock signal CLK to generate an internal chip selection signal ICS from the first chip selection signal CS1. The input buffer 100 may be synchronized with a rising edge of the clock signal CLK to generate first to seventh internal command/address signals ICA<1:7> from the first to seventh command/address signals CA<1:7>.

The pulse generation circuit 200 may include a command decoder 210 and a flag signal generation circuit 220.

The command decoder 210 may be synchronized with the internal clock signal ICLK to generate a write signal WT which is enabled if the internal chip selection signal ICS and the first to seventh internal command/address signals ICA<1:7> have a logic level combination for performing the write operation. The command decoder 210 may be synchronized with the internal clock signal ICLK to generate a read signal RD which is enabled if the internal chip selection signal ICS and the first to seventh internal command/address signals ICA<1:7> have a logic level combination for performing the read operation.

The flag signal generation circuit 220 may shift the write signal WT according to a write latency signal WL to generate a write flag signal WTF. The flag signal generation circuit 220 may shift the read signal RD according to a read latency signal RL to generate a read flag signal RDF.

The I/O control circuit 300 may include a mode register 310 and a drive control circuit 320.

The mode register 310 may be synchronized with the internal clock signal ICLK to store information on a resistance value of the I/O line IO, which is included in the first to seventh internal command/address signals ICA<1:7>, according to the internal chip selection signal ICS and the first to seventh internal command/address signals ICA<1:7> during a mode register write operation. The information on the resistance value of the I/O line IO may be inputted to the mode register 310 through certain bits included in the first to seventh internal command/address signals ICA<1:7>. The mode register 310 may be synchronized with the internal clock signal ICLK to store first and second target termination signals DQ_ODT<1:2>, first and second non-target termination signals NT_ODT<1:2>, the write latency signal WL, the read latency signal RL, a target termination operation signal ODTMR and a non-target termination operation signal NTMR according to the internal chip selection signal ICS and the first to seventh internal command/address signals ICA<1:7> during the mode register write operation. The first and second target termination signals DQ_ODT<1:

2>, the first and second non-target termination signals NT_ODT<1:2>, the write latency signal WL, the read latency signal RL, the target termination operation signal ODTMR and the non-target termination operation signal NTMR may be inputted to the mode register 310 through certain bits included in the first to seventh internal command/address signals ICA<1:7>. The mode register 310 may be synchronized with the internal clock signal ICLK to output the resistance value information of the I/O line IO as first and second pre-pull-up control signals PU_PRE<1:2> and first and second pre-pull-down control signals PD_PRE<1:2> according to the internal chip selection signal ICS and the first to seventh internal command/address signals ICA<1:7> during a mode register read operation. The mode register 310 may be synchronized with the internal clock signal ICLK to output the first and second target termination signals DQ_ODT<1:2>, the first and second non-target termination signals NT_ODT<1:2>, the write latency signal WL, the read latency signal RL, the target termination operation signal ODTMR and the non-target termination operation signal NTMR according to the internal chip selection signal ICS and the first to seventh internal command/address signals ICA<1:7> during the mode register read operation. The mode register 310 may be synchronized with the internal clock signal ICLK to store a data process operation signal DMIMR and a strobe operation signal DQSMR according to the internal chip selection signal ICS and the first to seventh internal command/address signals ICA<1:7> during the mode register write operation. The data process operation signal DMIMR and the strobe operation signal DQSMR may be inputted to the mode register 310 through certain bits included in the first to seventh internal command/address signals ICA<1:7>. The mode register 310 may be synchronized with the internal clock signal ICLK to output the data process operation signal DMIMR and the strobe operation signal DQSMR according to the internal chip selection signal ICS and the first to seventh internal command/address signals ICA<1:7> during the mode register read operation.

The drive control circuit 320 may generate a data enablement signal OENDATA according to logic levels of the target termination operation signal ODTMR and the non-target termination operation signal NTMR if the write flag signal WTF and the read flag signal RDF are inputted to the drive control circuit 320. The drive control circuit 320 may generate a data process enablement signal OENDMI from the data process operation signal DMIMR according to logic levels of the target termination operation signal ODTMR and the non-target termination operation signal NTMR if the write flag signal WTF and the read flag signal RDF are inputted to the drive control circuit 320. The drive control circuit 320 may generate a strobe enablement signal OENDQS from the strobe operation signal DQSMR according to logic levels of the target termination operation signal ODTMR and the non-target termination operation signal NTMR if the write flag signal WTF and the read flag signal RDF are inputted to the drive control circuit 320.

The drive control circuit 320 may generate first to fourth pull-up control signals PUD<1:4> from the first and second pre-pull-up control signals PU_PRE<1:2> and may generate first to fourth pull-down control signals PDD<1:4> from the first and second pre-pull-down control signals PD_PRE<1:2>, according to logic levels of the target termination operation signal ODTMR and the non-target termination operation signal NTMR if the write flag signal WTF is inputted to the drive control circuit 320. The drive control circuit 320 may generate the first to fourth pull-up control signals PUD<1:4> from the first and second pre-pull-up control signals PUD<1:4> from the first and second pre-pull-up control signals PU_PRE<1:2> and may generate the first to fourth pull-down control signals PDD<1:4> from the first and second target termination signals DQ_ODT<1:2>, according to logic levels of the target termination operation signal ODTMR and the non-target termination operation signal NTMR if the write flag signal WTF is inputted to the drive control circuit 320. The drive control circuit 320 may generate the first to fourth pull-up control signals PUD<1:4> from the first and second pre-pull-up control signals PU_PRE<1:2> and may generate the first to fourth pull-down control signals PDD<1:4> from the first and second non-target termination signals NT_ODT<1:2>, according to logic levels of the target termination operation signal ODTMR and the non-target termination operation signal NTMR if the write flag signal WTF is inputted to the drive control circuit 320.

The drive signal generation circuit 400 may include a pull-up/pull-down signal generation circuit 410 and a drive signal output circuit 420.

The pull-up/pull-down signal generation circuit 410 may generate a pull-up signal PUON and a pull-down signal PDON, one of which is selectively enabled according to a logic level of the data DATA. The pull-up/pull-down signal generation circuit 410 may generate the pull-up signal PUON and the pull-down signal PDON, one of which is selectively enabled according to a logic level of the data processing signal DMI. The pull-up/pull-down signal generation circuit 410 may generate the pull-up signal PUON and the pull-down signal PDON, one of which is selectively enabled according to a logic level of the strobe signal DQS. For example, the pull-up/pull-down signal generation circuit 410 may generate the pull-up signal PUON which is enabled if the data DATA has a logic "high" level and may generate the pull-down signal PDON which is enabled if the data DATA has a logic "low" level. As used herein, a signal, such the data or chip selection signal etc., having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

The drive signal output circuit 420 may generate the first to fourth pull-up drive signals PU1<1:4> from the first to fourth pull-up control signals PUD<1:4> if the pull-up signal PUON is enabled. The drive signal output circuit 420 may generate the first to fourth pull-down drive signals PD1<1:4> from the first to fourth pull-down control signals PDD<1:4> if the pull-down signal PDON is enabled. The drive signal output circuit 420 may generate the first to fourth pull-down drive signals PD1<1:4> from the first to fourth pull-down control signals PDD<1:4> if the data enablement signal OENDATA is enabled.

The driver 500 may generate the data DATA from the first internal data ID1 during the read operation and may generate the first internal data ID1 from the data DATA if the data enablement signal OENDATA is enabled during the write operation. The driver 500 may generate the data processing signal DMI from the first internal data processing signal IDMI1 during the read operation and may generate the first internal data processing signal IDMI1 from the data processing signal DMI if the data process enablement signal OENDMI is enabled during the write operation. The driver 500 may generate the strobe signal DQS from the first internal strobe signal IDQS1 during the read operation and may generate the first internal strobe signal IDQS1 from the strobe signal DQS if the strobe enablement signal OENDQS is enabled during the write operation.

Edges of the clock signal CLK and logic levels of the chip selection signal CS and the first to seventh command/address signals CA<1:7> for activating mode register write operations MRW1 and MRW2, a mode register read operation MRR, a write operation WRITE and a write operation READ performed in an embodiment of the present disclosure will be described hereinafter with reference to FIG. 3.

The mode register write operations MRW1 and MRW2 may include a first mode register write operation MRW1 and a second mode register write operation MRW2. That is, the number of the mode register write operations may be set as two or more according to an amount of information stored into the mode register 310. First, if the chip selection signal CS has a logic "high(H)" level and the first to seventh command/address signals CA<1:7> have a logic level combination of 'L,L,L,H,H,L,H' at a rising edge of the clock signal CLK, the semiconductor system 1 may be realized to perform the first mode register write operation MRW1. In the first to seventh command/address signals CA<1:7>, the logic level combination of 'L,L,L,H,H,L,H' means that the first command/address signal CA<1> has a logic "low(L)" level, the second command/address signal CA<2> has a logic "low(L)" level, the third command/address signal CA<3> has a logic "low(L)" level, the fourth command/address signal CA<4> has a logic "high(H)" level, the fifth command/address signal CA<5> has a logic "high(H)" level, the sixth command/address signal CA<6> has a logic "low(L)" level, and the seventh command/address signal CA<7> has a logic "high(H)" level.

Next, if the chip selection signal CS has a logic "high(H)" level and the first to seventh command/address signals CA<1:7> have a logic level combination of 'L,L,L,H,L,L,X' at a rising edge of the clock signal CLK, the semiconductor system 1 may be realized to perform the second mode register write operation MRW2. In the first to seventh command/address signals CA<1:7>, the logic level combination of 'L,L,L,H,L,L,X' means that the first command/address signal CA<1> has a logic "low(L)" level, the second command/address signal CA<2> has a logic "low(L)" level, the third command/address signal CA<3> has a logic "low(L)" level, the fourth command/address signal CA<4> has a logic "high(H)" level, the fifth command/address signal CA<5> has a logic "low(L)" level, and the sixth command/address signal CA<6> has a logic "low(L)" level. In such a case, a logic state "X" of the seventh command/address signal CA<7> may correspond to a "DON'T CARE STATE".

Next, if the chip selection signal CS has a logic "high(H)" level and the first to seventh command/address signals CA<1:7> have a logic level combination of 'L,L,L,H,H,L,L' at a rising edge of the clock signal CLK, the semiconductor system 1 may be realized to perform the mode register read operation MRR. In the first to seventh command/address signals CA<1:7>, the logic level combination of 'L,L,L,H,H,L,L' means that the first command/address signal CA<1> has a logic "low(L)" level, the second command/address signal CA<2> has a logic "low(L)" level, the third command/address signal CA<3> has a logic "low(L)" level, the fourth command/address signal CA<4> has a logic "high(H)" level, the fifth command/address signal CA<5> has a logic "high(H)" level, the sixth command/address signal CA<6> has a logic "low(L)" level, and the seventh command/address signal CA<7> has a logic "low(L)" level.

Next, if the chip selection signal CS has a logic "high(H)" level and the first to seventh command/address signals CA<1:7> have a logic level combination of 'L,L,H,X,X,X,X' at a rising edge of the clock signal CLK, the semiconductor system 1 may be realized to perform the write operation WRITE. In the first to seventh command/address signals CA<1:7>, the logic level combination of 'L,L,H,X,X,X,X' means that the first command/address signal CA<1> has a logic "low(L)" level, the second command/address signal CA<2> has a logic "low(L)" level, and the third command/address signal CA<3> has a logic "high(H)" level. In such a case, a logic state "X" of the fourth to seventh command/address signals CA<4:7> may correspond to a "DON'T CARE STATE".

Finally, if the chip selection signal CS has a logic "high (H)" level and the first to seventh command/address signals CA<1:7> have a logic level combination of 'H,L,L,X,X,X,X' at a rising edge of the clock signal CLK, the semiconductor system 1 may be realized to perform the read operation READ. In the first to seventh command/address signals CA<1:7>, the logic level combination of 'H,L,L,X,X,X,X' means that the first command/address signal CA<1> has a logic "high(H)" level, the second command/address signal CA<2> has a logic "low(L)" level, and the third command/address signal CA<3> has a logic "low(L)" level. In such a case, a logic state "X" of the fourth to seventh command/address signals CA<4:7> may also correspond to a "DON'T CARE STATE".

Figure 4:
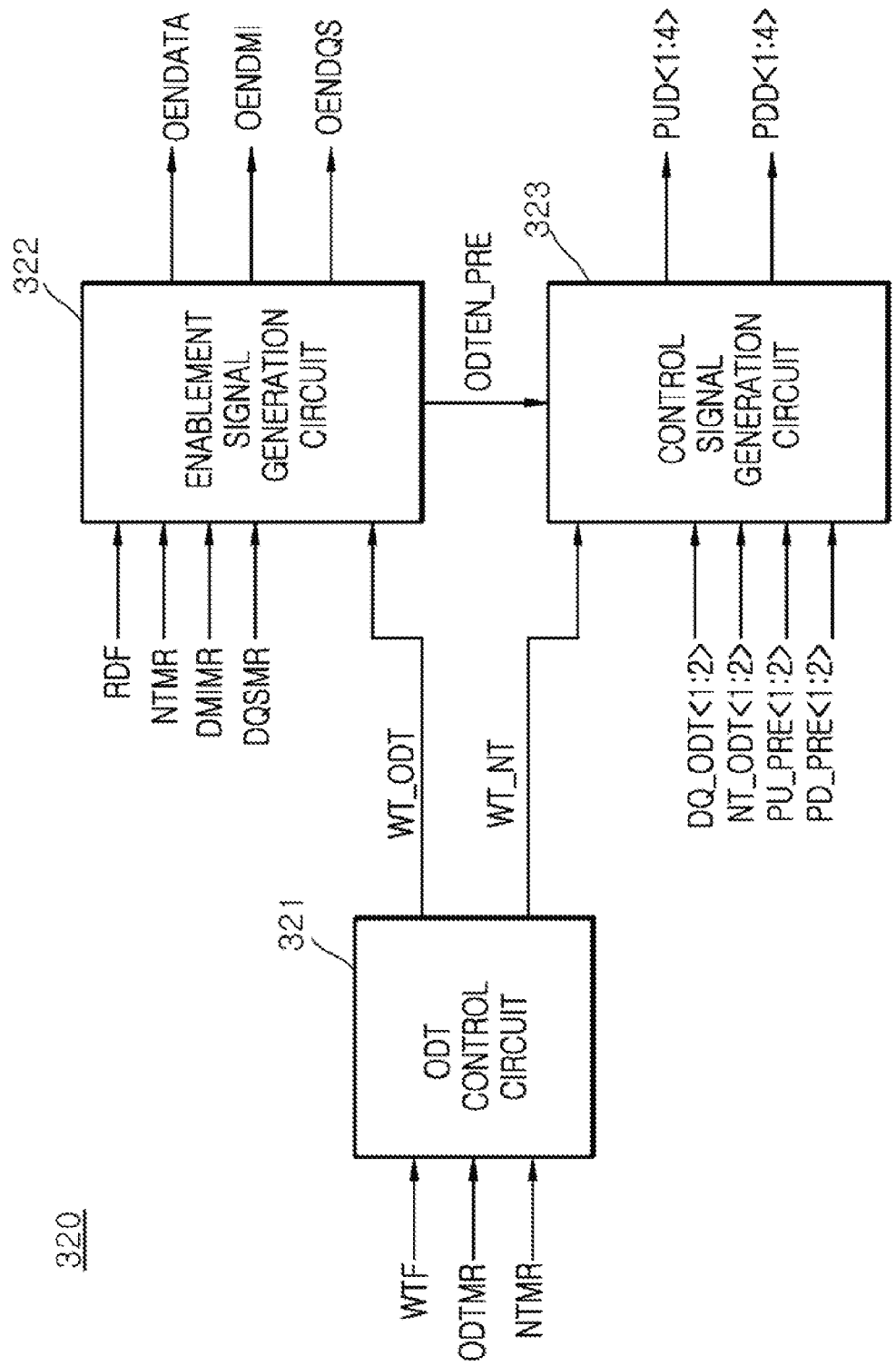
FIG. 4 is a block diagram illustrating a configuration of a drive control circuit included in the first internal I/O circuit of FIG. 2.

Referring to FIG. 4, the drive control circuit 320 may include an ODT control circuit 321, an enablement signal generation circuit 322 and a control signal generation circuit 323.

The ODT control circuit 321 may generate a target write signal WT_ODT and a non-target write signal WT_NT which are enabled at a point in time when the write flag signal WTF is inputted to the ODT control circuit 321, according to the target termination operation signal ODTMR and the non-target termination operation signal NTMR.

The enablement signal generation circuit 322 may generate the data enablement signal OENDATA from the read flag signal RDF according to the non-target termination operation signal NTMR during the read operation. The enablement signal generation circuit 322 may output the target write signal WT_ODT as a pre-enablement signal ODTEN_PRE and may inversely buffer the target write signal WT_ODT to generate the data enablement signal OENDATA, according to the non-target termination operation signal NTMR during the write operation. The enablement signal generation circuit 322 may generate the data process enablement signal OENDMI from the data process operation signal DMIMR according to the non-target termination operation signal NTMR during the read operation and the write operation. The enablement signal generation circuit 322 may generate the strobe enablement signal OENDQS from the strobe operation signal DQSMR according to the non-target termination operation signal NTMR during the read operation and the write operation.

The control signal generation circuit 323 may generate the first to fourth pull-up control signals PUD<1:4> from the first and second pre-pull-up control signals PU_PRE<1:2> according to the non-target write signal WT_NT. The control signal generation circuit 323 may generate the first to fourth pull-down control signals PDD<1:4> from the first and second pre-pull-down control signals PD_PRE<1:2> according to the non-target write signal WT_NT. The control signal generation circuit 323 may generate the first to fourth pull-down control signals PDD<1:4> from the first and second target termination signals DQ_ODT<1:2> according to the pre-enablement signal ODTEN_PRE. The control signal generation circuit 323 may generate the first to fourth pull-down control signals PDD<1:4> from the first and second non-target termination signals NT_ODT<1:2> according to the pre-enablement signal ODTEN_PRE.

Figure 5:
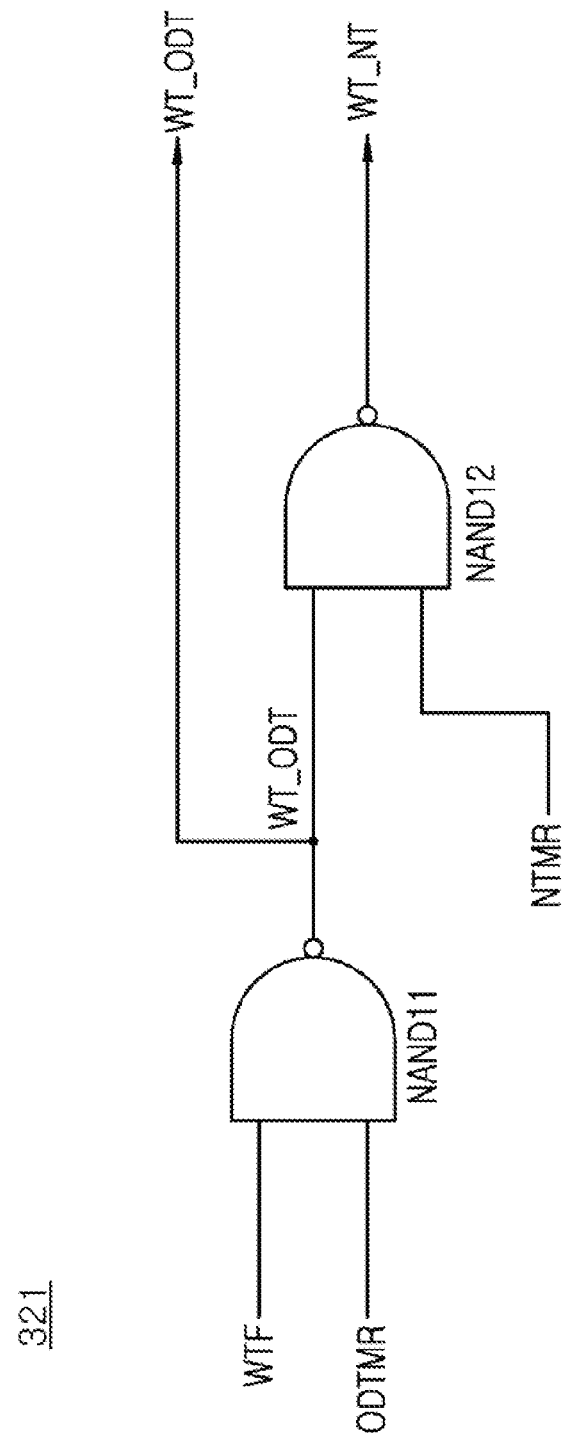
FIG. 5 is a circuit diagram illustrating a configuration of an ODT control circuit included in the drive control circuit of FIG. 4.

Referring to FIG. 5, the ODT control circuit 321 may be configured to perform NAND logic operations and may be realized using, for example but not limited to, NAND gates NAND11 and NAND12.

The NAND gate NAND11 may generate the target write signal WT_ODT which is enabled to have a logic "low" level at a point in time when the target termination operation signal ODTMR having a logic "high" level and the write flag signal WTF having a logic "high" level are inputted to the NAND gate NAND11.

The NAND gate NAND12 may generate the non-target write signal WT_NT which is enabled to have a logic "high" level if the non-target termination operation signal NTMR having a logic "high" level and the target write signal WT_ODT having a logic "low" level are inputted to the NAND gate NAND12.

Figure 6:
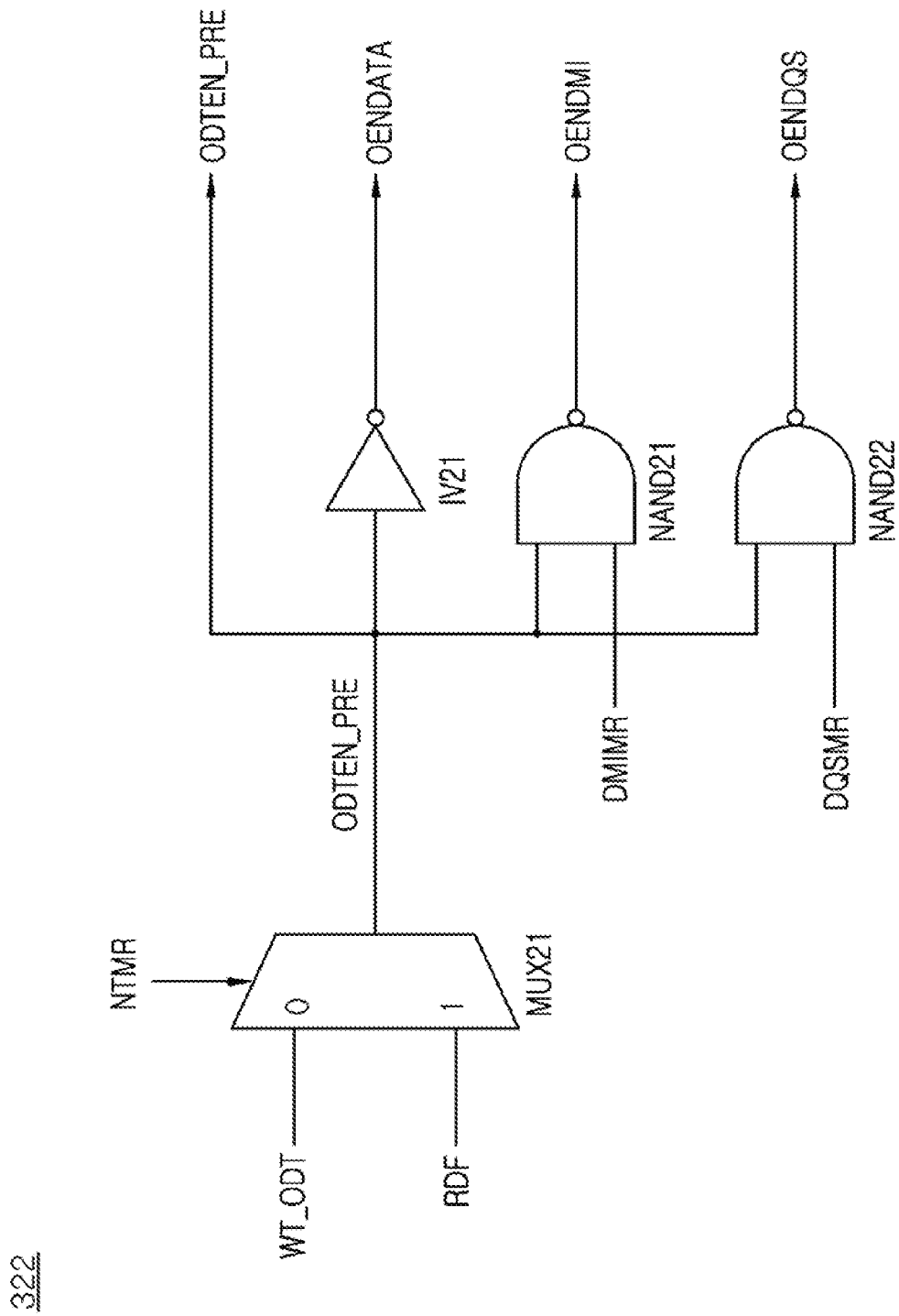
FIG. 6 is a circuit diagram illustrating a configuration of an enablement signal generation circuit included in the drive control circuit of FIG. 4.

Referring to FIG. 6, the enablement signal generation circuit 322 may be configured to perform NAND and inversion operations and may be realized using, for example but not limited to, a multiplexer MUX21, an inverter IV21 and NAND gates NAND21 and NAND22.

The multiplexer MUX21 may output the target write signal WT_ODT as the pre-enablement signal ODTEN_PRE if the non-target termination operation signal NTMR has a logic "low" level. The multiplexer MUX21 may output the read flag signal RDF as the pre-enablement signal ODTEN_PRE if the non-target termination operation signal NTMR has a logic "high" level.

The inverter IV21 may inversely buffer the pre-enablement signal ODTEN_PRE to generate the data enablement signal OENDATA.

The NAND gate NAND21 may inversely buffer the data process operation signal DMIMR to generate the data process enablement signal OENDMI if the pre-enablement signal ODTEN_PRE is enabled to have a logic "high" level.

The NAND gate NAND22 may inversely buffer the strobe operation signal DQSMR to generate the strobe enablement signal OENDQS if the pre-enablement signal ODTEN_PRE is enabled to have a logic "high" level.

Figure 7:
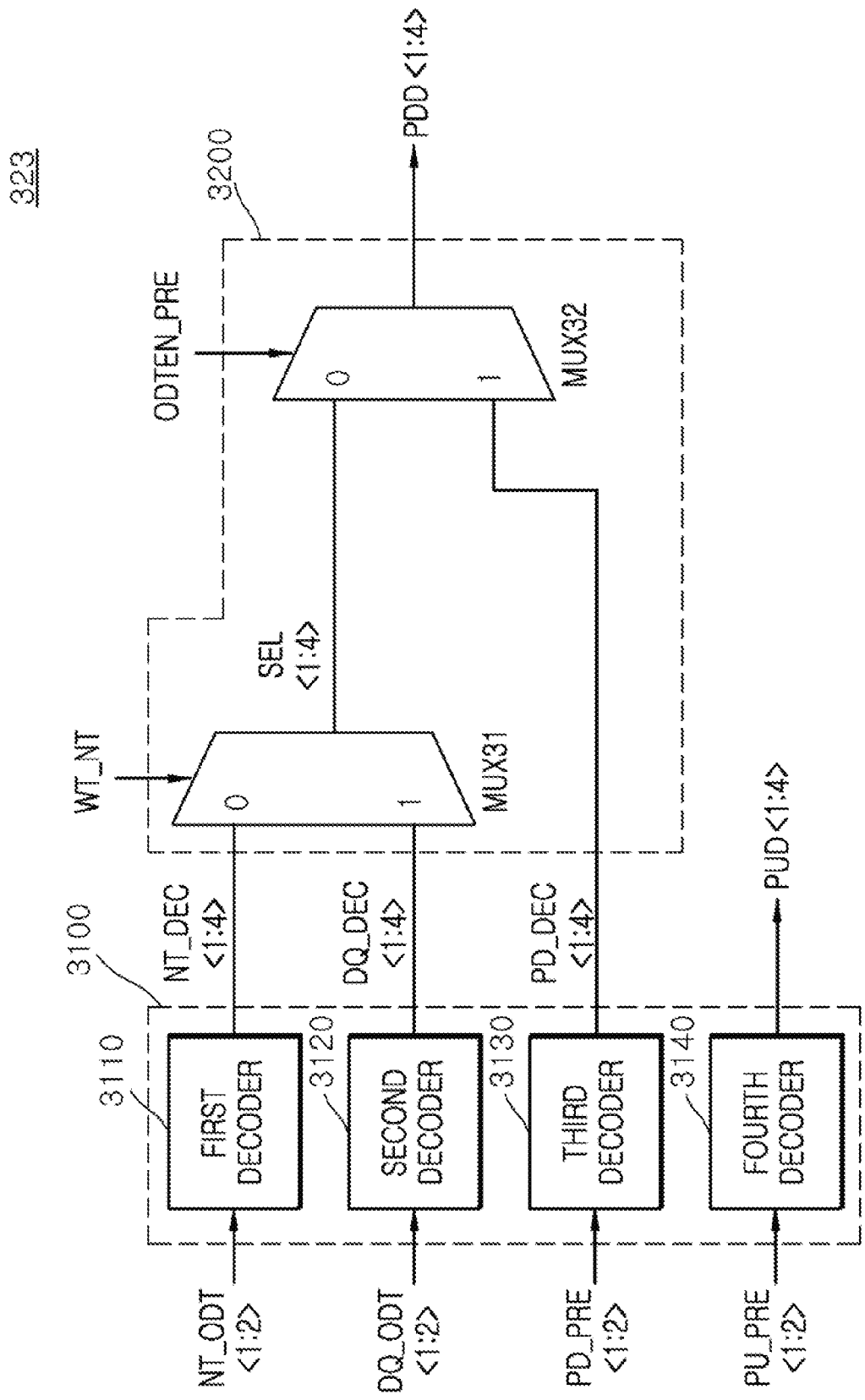
FIG. 7 is a block diagram illustrating a configuration of a control signal generation circuit included in the drive control circuit of FIG. 4.

Referring to FIG. 7, the control signal generation circuit 323 may include a decoded signal generation circuit 3100 and a selection/transmission circuit 3200.

The decoded signal generation circuit 3100 may include a first decoder 3110, a second decoder 3120, a third decoder 3130 and a fourth decoder 3140.

The first decoder 3110 may decode the first and second non-target termination signals NT_ODT<1:2> to generate first to fourth non-target decoded signals NT_DEC<1:4>.

The second decoder 3120 may decode the first and second target termination signals DQ_ODT<1:2> to generate first to fourth target decoded signals DQ_DEC<1:4>.

The third decoder 3130 may decode the first and second pre-pull-down control signals PD_PRE<1:2> to generate first to fourth pull-down decoded signals PD_DEC<1:4>.

The fourth decoder 3140 may decode the first and second pre-pull-up control signals PU_PRE<1:2> to generate the first to fourth pull-up control signals PUD<1:4>.

The selection/transmission circuit 3200 may include multiplexers MUX31 and MUX32.

The multiplexer MUX31 may output the first to fourth non-target decoded signals NT_DEC<1:4> as first to fourth selection signals SEL<1:4> if the non-target write signal WT_NT has a logic "low" level. The multiplexer MUX31 may output the first to fourth target decoded signals DQ_DEC<1:4> as the first to fourth selection signals SEL<1:4> if the non-target write signal WT_NT has a logic "high" level.

The multiplexer MUX32 may output the first to fourth selection signals SEL<1:4> as the first to fourth pull-down control signals PDD<1:4> if the pre-enablement signal ODTEN_PRE has a logic "low" level. The multiplexer MUX32 may output the first to fourth pull-down decoded signals PD_DEC<1:4> as the first to fourth pull-down control signals PDD<1:4> if the pre-enablement signal ODTEN_PRE has a logic "high" level.

Figure 8:
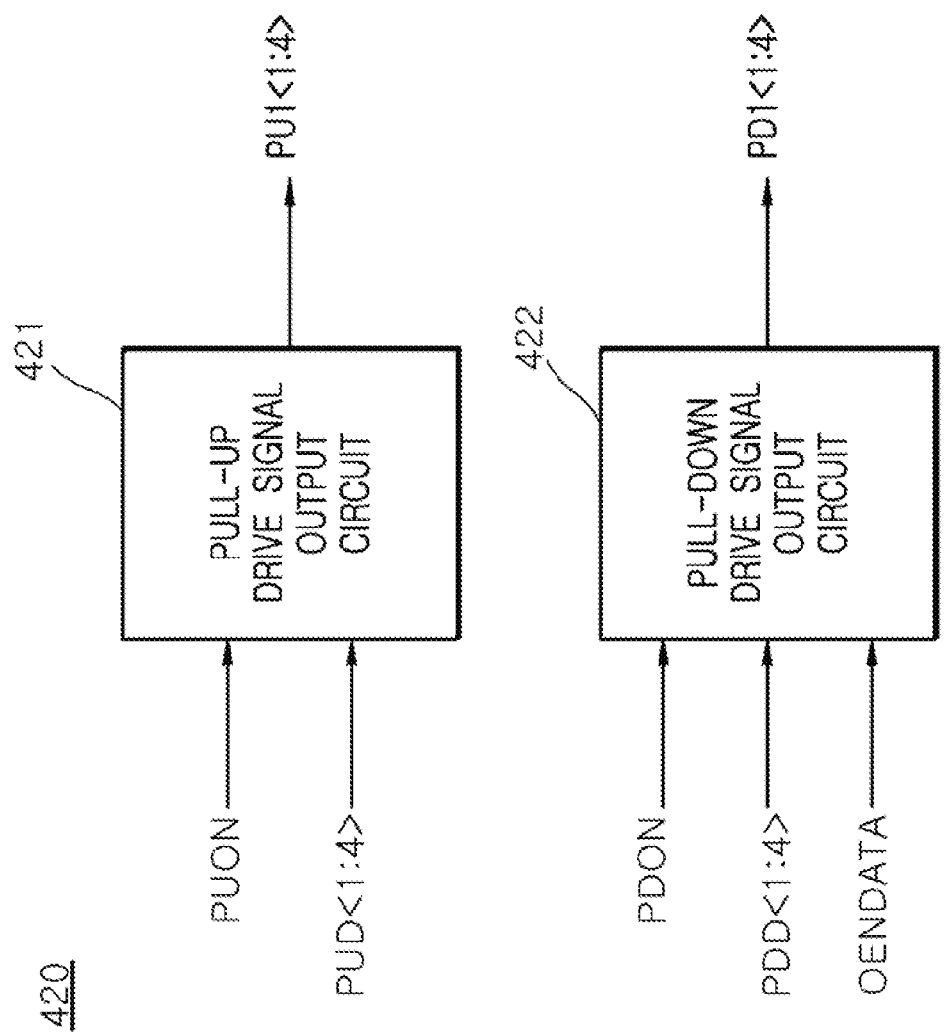
FIG. 8 is a block diagram illustrating a configuration of a drive signal output circuit included in the first internal I/O circuit of FIG. 2.

Referring to FIG. 8, the drive signal output circuit 420 may include a pull-up drive signal output circuit 421 and a pull-down drive signal output circuit 422.

The pull-up drive signal output circuit 421 may output the first to fourth pull-up control signals PUD<1:4> as the first to fourth pull-up drive signals PU1<1:4> if the pull-up signal PUON is enabled.

The pull-down drive signal output circuit 422 may output the first to fourth pull-down control signals PDD<1:4> as the first to fourth pull-down drive signals PD1<1:4> if the pull-down signal PDON is enabled. The pull-down drive signal output circuit 422 may output the first to fourth pull-down control signals PDD<1:4> as the first to fourth pull-down drive signals PD1<1:4> if the data enablement signal OENDATA is enabled.

Figure 9:
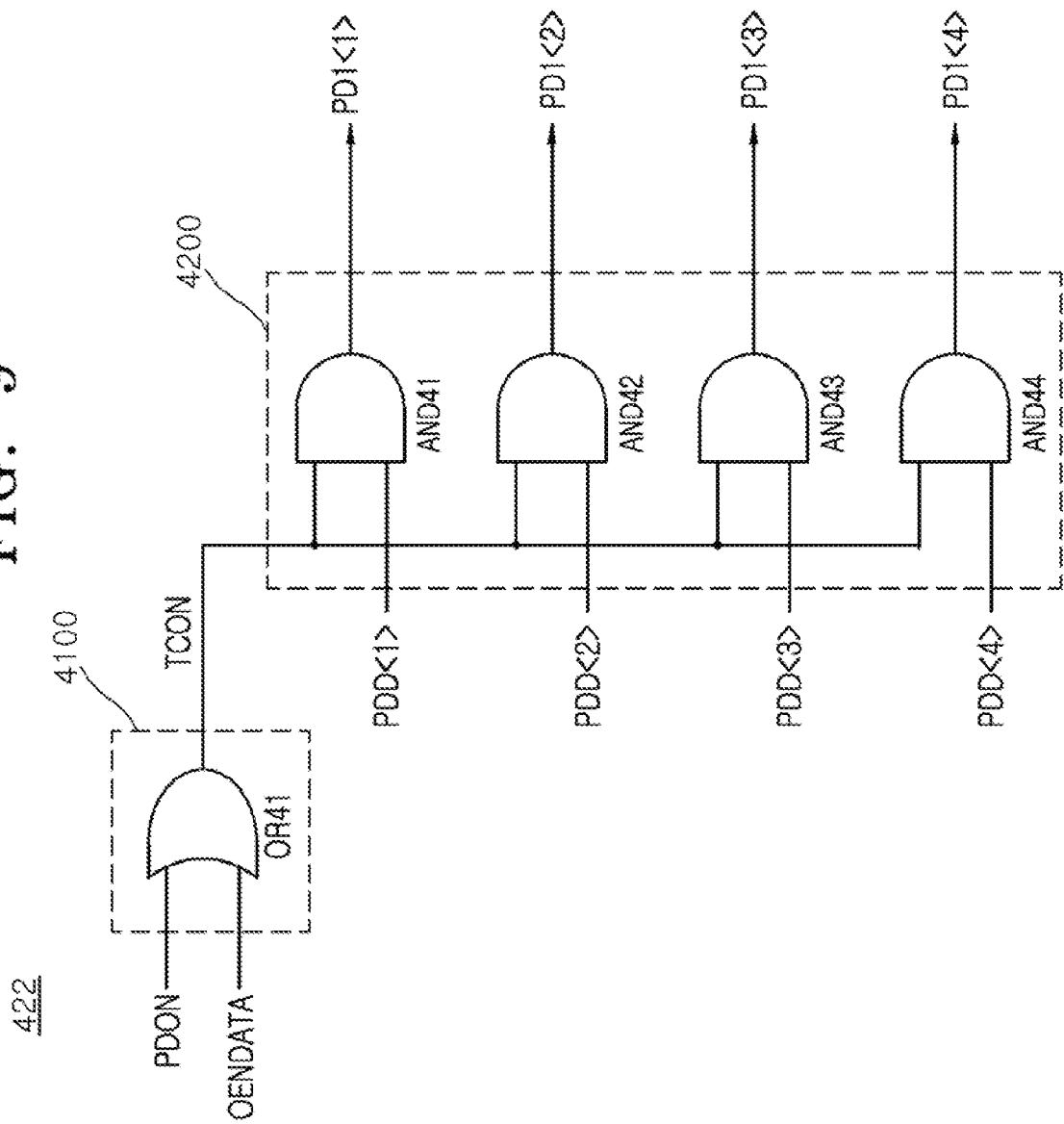
FIG. 9 is a circuit diagram illustrating a configuration of a pull-down drive signal output circuit included in the drive signal output circuit of FIG. 8.

Referring to FIG. 9, the pull-down drive signal output circuit 422 may include a transmission control signal generation circuit 4100 and a signal transmission circuit 4200.

The transmission control signal generation circuit 4100 may be configured to perform an OR logic operation and may be realized using, for example but not limited to, an OR gate OR41.

The transmission control signal generation circuit 4100 may generate a transmission control signal TCON which is enabled to have a logic "high" level if any one of the pull-down signal PDON and the data enablement signal OENDATA is enabled to have a logic "high" level. The transmission control signal generation circuit 4100 may perform a logical "OR" operation of the pull-down signal PDON and the data enablement signal OENDATA to generate the transmission control signal TCON.

The signal transmission circuit 4200 may be configured to perform an AND logic operation and may be realized using, for example but not limited to, AND gates AND41, AND42, AND43 and AND44.

The AND gate AND41 may output the first pull-down control signal PDD<1> as the first pull-down drive signal PD1<1> if the transmission control signal TCON is enabled to have a logic "high" level.

The AND gate AND42 may output the second pull-down control signal PDD<2> as the second pull-down drive signal PD1<2> if the transmission control signal TCON is enabled to have a logic "high" level.

The AND gate AND43 may output the third pull-down control signal PDD<3> as the third pull-down drive signal PD1<3> if the transmission control signal TCON is enabled to have a logic "high" level.

The AND gate AND44 may output the fourth pull-down control signal PDD<4> as the fourth pull-down drive signal PD1<4> if the transmission control signal TCON is enabled to have a logic "high" level.

The second internal I/O circuit 31 of the second semiconductor device 30 may be realized using substantially the same circuit as the first internal I/O circuit 21 described with reference to FIGS. 1 to 9 except I/O signals thereof. Thus, a description of the second internal I/O circuit 31 will be omitted hereinafter.

Figure 10:
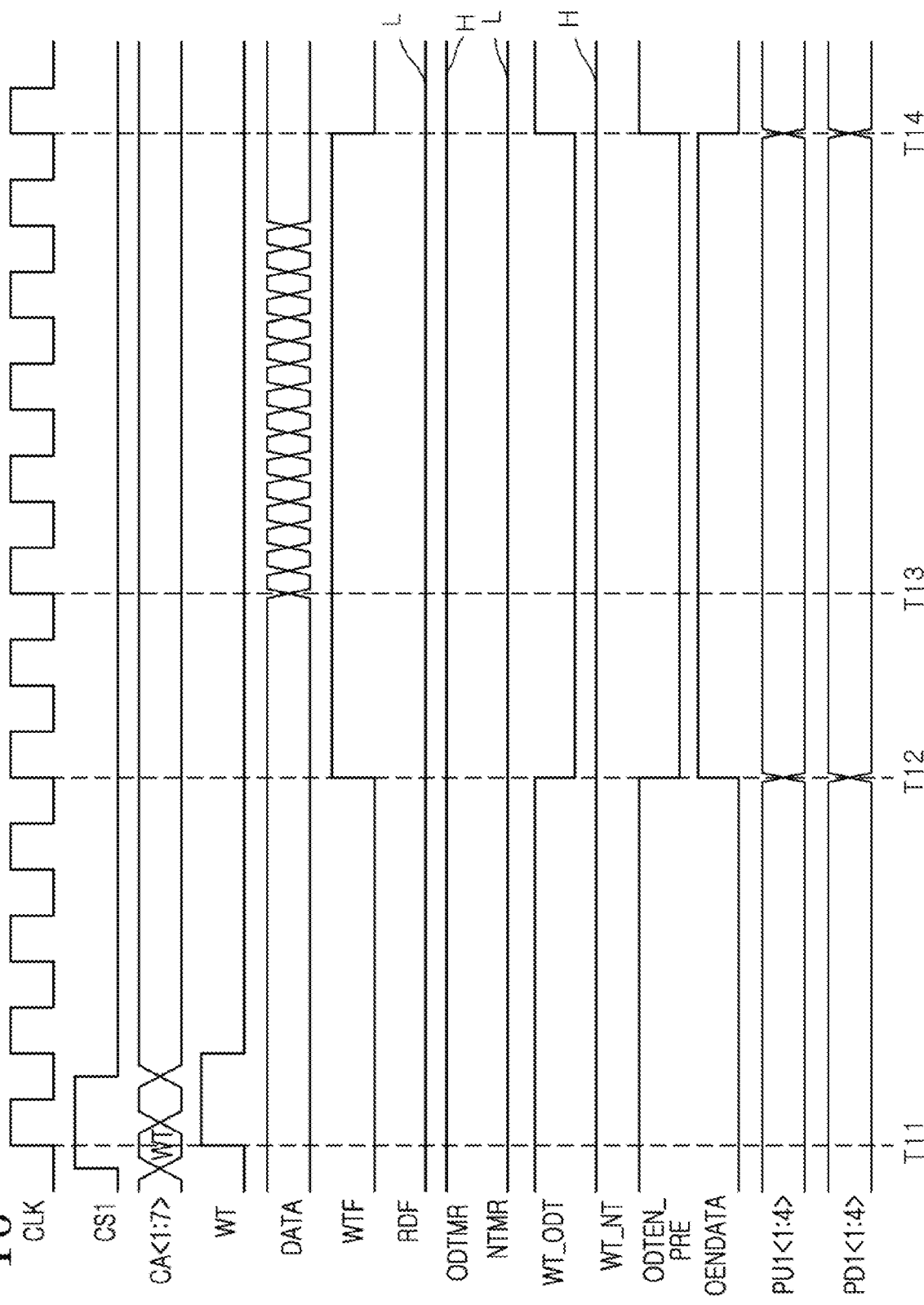
FIGS. 10, 11 and 12 are timing diagrams illustrating operations of a semiconductor system according to an embodiment of the present disclosure.

An operation of the semiconductor system 1 according to an embodiment will be described hereinafter with reference to FIG. 10 in conjunction with an example in which only the first semiconductor device 20 performs the write operation.

At a point of time "T11", the controller 10 may output the clock signal CLK, the first chip selection signal CS1 and the first to seventh command/address signals CA<1:7> for performing the write operation. Because the first chip selection signal CS1 and the first to seventh command/address signals CA<1:7> are signals which are generated to perform the write operation, the controller termination circuit 12 of the controller 10 may be turned off.

The input buffer 100 of the first internal I/O circuit 21 may be synchronized with a rising edge of the clock signal CLK to generate the internal clock signal ICLK, to generate the internal chip selection signal ICS from the first chip selection signal CS1, and to generate the first to seventh internal command/address signals ICA<1:7> from the first to seventh command/address signals CA<1:7>.

The pulse generation circuit 200 of the first internal I/O circuit 21 may be synchronized with the internal clock signal ICLK to generate the write signal WT which is enabled to have a logic "high" level because the internal chip selection signal ICS and the first to seventh internal command/address signals ICA<1:7> have a logic level combination for performing the write operation. The pulse generation circuit 200 may be synchronized with the internal clock signal ICLK to generate the read signal RD which is disabled to have a logic "low" level because the internal chip selection signal ICS and the first to seventh internal command/address signals ICA<1:7> have a logic level combination for performing the write operation.

At a point of time "T12", the pulse generation circuit 200 of the first internal I/O circuit 21 may shift the write signal WT according to the write latency signal WL to generate the write flag signal WTF having a logic "high" level. In such a case, the pulse generation circuit 200 may generate the read flag signal RDF having a logic "low" level.

The ODT control circuit 321 of the drive control circuit 320 may generate the target write signal WT_ODT enabled to have a logic "low" level and the non-target write signal WT_NT having a logic "high" level, according to the target termination operation signal ODTMR having a logic "high" level and the non-target termination operation signal NTMR having a logic "low" level.

The enablement signal generation circuit 322 of the drive control circuit 320 may output the target write signal WT_ODT having a logic "low" level as the pre-enablement signal ODTEN_PRE according to the non-target termination operation signal NTMR having a logic "low" level. The enablement signal generation circuit 322 may inversely buffer the target write signal WT_ODT to generate the data enablement signal OENDATA having a logic "high" level.

The control signal generation circuit 323 of the drive control circuit 320 may generate the first to fourth pull-up control signals PUD<1:4> from the first and second pre-pull-up control signals PU_PRE<1:2> and may generate the first to fourth pull-down control signals PDD<1:4> from the first and second target termination signals DQ_ODT<1:2> according to the non-target write signal WT_NT having a logic "high" level.

The drive signal output circuit 420 may generate the first to fourth pull-up drive signals PU1<1:4> from the first to fourth pull-up control signals PUD<1:4> and may generate the first to fourth pull-down drive signals PD1<1:4> from the first to fourth pull-down control signals PDD<1:4>. That is, the first to fourth pull-down drive signals PD1<1:4> may be generated from the first and second target termination signals DQ_ODT<1:2>.

At a point of time "T13", the external I/O circuit 11 of the controller 10 may output the data DATA through the I/O line 10.

The driver 500 may generate the first internal data ID1 from the data DATA according to the data enablement signal OENDATA having a logic "high" level.

The first internal termination circuit 22 may drive the I/O line IO with a drivability which is adjusted according to the first to fourth pull-up drive signals PU1<1:4> and the first to fourth pull-down drive signals PD1<1:4>. In such a case, because the I/O line IO is driven by the adjusted drivability, it may be possible to suppress or reduce a reflection phenomenon of the data DATA.

The first semiconductor circuit 23 may store the first internal data ID1.

A time period from the point of time "T11" till the point of time "T13" may be set as a write latency period.

If the write operation terminates after a point of time "T14", the write flag signal WTF may be disabled to have a logic "low" level to inhibit the generation of the first to fourth pull-up drive signals PU1<1:4> and the first to fourth pull-down drive signals PD1<1:4>. That is, the first internal termination circuit 22 may terminate driving the I/O line IO according to the first to fourth pull-up drive signals PU1<1:4> and the first to fourth pull-down drive signals PD1<1:4>.

Figure 11:
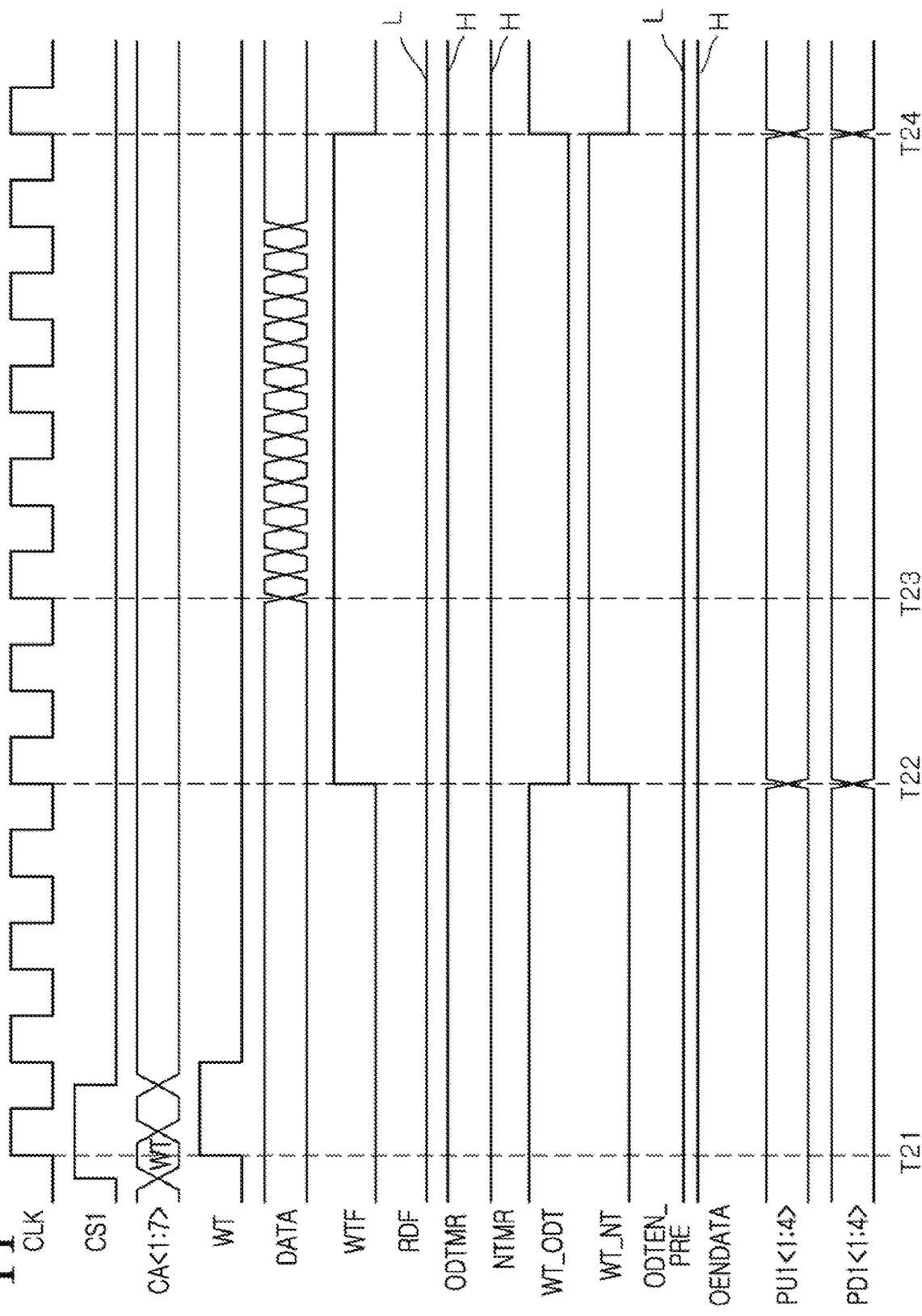

An operation of the semiconductor system 1 according to an embodiment will be described hereinafter with reference to FIG. 11 in conjunction with an example in which the first semiconductor device 20 of the first and second semiconductor devices 20 and 30 performs the write operation.

At a point of time "T21", the controller 10 may output the clock signal CLK, the first chip selection signal CS1 and the first to seventh command/address signals CA<1:7> for performing the write operation. Because the first chip selection signal CS1 and the first to seventh command/address signals CA<1:7> are signals which are generated to perform the write operation, the controller termination circuit 12 of the controller 10 may be turned off.

The input buffer 100 of the first internal I/O circuit 21 may be synchronized with a rising edge of the clock signal CLK to generate the internal clock signal ICLK, to generate the internal chip selection signal ICS from the first chip selection signal CS1, and to generate the first to seventh internal command/address signals ICA<1:7> from the first to seventh command/address signals CA<1:7>.

The pulse generation circuit 200 of the first internal I/O circuit 21 may be synchronized with the internal clock signal ICLK to generate the write signal WT which is enabled to have a logic "high" level because the internal chip selection signal ICS and the first to seventh internal command/address signals ICA<1:7> have a logic level combination for performing the write operation. The pulse generation circuit 200 may be synchronized with the internal clock signal ICLK to generate the read signal RD which is disabled to have a logic "low" level because the internal chip selection signal ICS and the first to seventh internal command/address signals ICA<1:7> have a logic level combination for performing the write operation.

At a point of time "T22", the pulse generation circuit 200 of the first internal I/O circuit 21 may shift the write signal WT according to the write latency signal WL to generate the write flag signal WTF having a logic "high" level. In such a case, the pulse generation circuit 200 may generate the read flag signal RDF having a logic "low" level.

The ODT control circuit 321 of the drive control circuit 320 may generate the target write signal WT_ODT enabled to have a logic "low" level and the non-target write signal WT_NT having a logic "high" level, according to the target termination operation signal ODTMR having a logic "high" level and the non-target termination operation signal NTMR having a logic "high" level.

The enablement signal generation circuit 322 of the drive control circuit 320 may output the read flag signal RDF having a logic "low" level as the pre-enablement signal ODTEN_PRE according to the non-target termination operation signal NTMR having a logic "high" level. The enablement signal generation circuit 322 may inversely buffer the read flag signal RDF to generate the data enablement signal OENDATA having a logic "high" level.

The control signal generation circuit 323 of the drive control circuit 320 may generate the first to fourth pull-up control signals PUD<1:4> from the first and second pre-pull-up control signals PU_PRE<1:2> and may generate the first to fourth pull-down control signals PDD<1:4> from the first and second target termination signals DQ_ODT<1:2> according to the non-target write signal WT_NT having a logic "high" level.

The drive signal output circuit 420 may generate the first to fourth pull-up drive signals PU1<1:4> from the first to fourth pull-up control signals PUD<1:4> and may generate the first to fourth pull-down drive signals PD1<1:4> from the first to fourth pull-down control signals PDD<1:4>. That is, the first to fourth pull-down drive signals PD1<1:4> may be generated from the first and second target termination signals DQ_ODT<1:2>.

At a point of time "T23", the external I/O circuit 11 of the controller 10 may output the data DATA through the I/O line IO.

The driver 500 may generate the first internal data ID1 from the data DATA according to the data enablement signal OENDATA having a logic "high" level.

The first internal termination circuit 22 may drive the I/O line IO with a drivability which is adjusted according to the first to fourth pull-up drive signals PU1<1:4> and the first to fourth pull-down drive signals PD1<1:4>. In such a case, because the I/O line IO is driven by the adjusted drivability, it may be possible to suppress or reduce a reflection phenomenon of the data DATA.

The first semiconductor circuit 23 may store the first internal data ID1.

A time period from the point of time "T21" till the point of time "T23" may be set as a write latency period.

After a point of time "T24", the write flag signal WTF may be disabled to have a logic "low" level to inhibit the generation of the first to fourth pull-up drive signals PU1<1:4> and the first to fourth pull-down drive signals PD1<1:4>. That is, the first internal termination circuit 22 may terminate driving the I/O line IO according to the first to fourth pull-up drive signals PU1<1:4> and the first to fourth pull-down drive signals PD1<1:4>.

Figure 12:
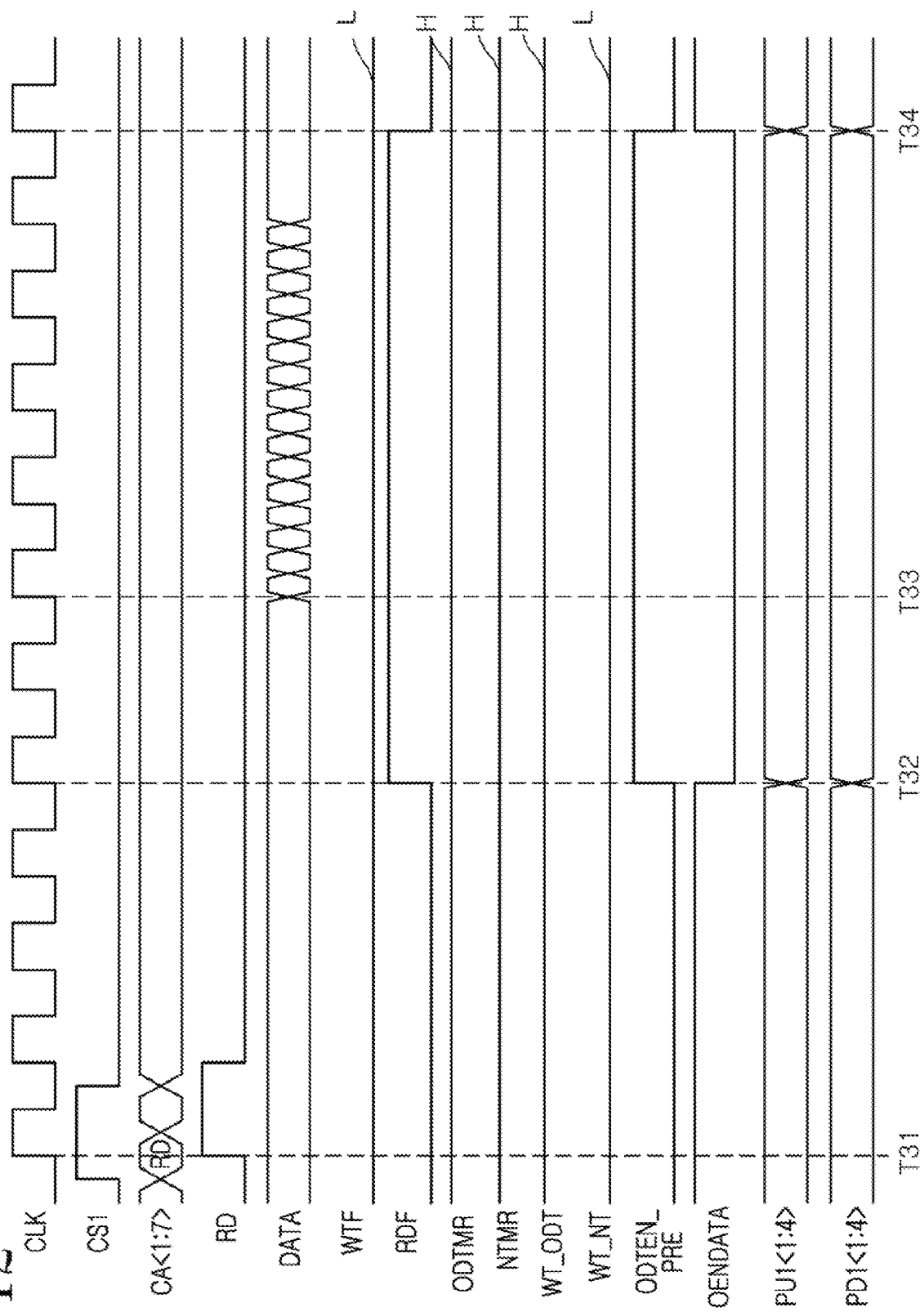

An operation of the semiconductor system 1 according to an embodiment will be described hereinafter with reference to FIG. 12 in conjunction with an example in which the first semiconductor device 20 of the first and second semiconductor devices 20 and 30 performs the read operation.

At a point of time "T31", the controller 10 may output the clock signal CLK, the first chip selection signal CS1 and the first to seventh command/address signals CA<1:7> for performing the read operation. Because the first chip selection signal CS1 and the first to seventh command/address signals CA<1:7> are signals which are generated to perform the read operation, the controller termination circuit 12 of the controller 10 may be turned on.

The input buffer 100 of the first internal I/O circuit 21 may be synchronized with a rising edge of the clock signal CLK to generate the internal clock signal ICLK, to generate the internal chip selection signal ICS from the first chip selection signal CS1, and to generate the first to seventh internal command/address signals ICA<1:7> from the first to seventh command/address signals CA<1:7>.

The pulse generation circuit 200 of the first internal I/O circuit 21 may be synchronized with the internal clock signal ICLK to generate the read signal RD which is enabled to have a logic "high" level because the internal chip selection signal ICS and the first to seventh internal command/address signals ICA<1:7> have a logic level combination for performing the read operation. The pulse generation circuit 200 may be synchronized with the internal clock signal ICLK to generate the write signal WT which is disabled to have a logic "low" level because the internal chip selection signal ICS and the first to seventh internal command/address signals ICA<1:7> have a logic level combination for performing the read operation.

At a point of time "T32", the pulse generation circuit 200 of the first internal I/O circuit 21 may shift the read signal RD according to the read latency signal RL to generate the read flag signal RDF having a logic "high" level. In such a case, the pulse generation circuit 200 may generate the write flag signal WTF having a logic "low" level.

The ODT control circuit 321 of the drive control circuit 320 may generate the target write signal WT_ODT disabled to have a logic "high" level and the non-target write signal WT_NT having a logic "low" level, according to the write flag signal WTF having a logic "low" level, the target termination operation signal ODTMR having a logic "high" level and the non-target termination operation signal NTMR having a logic "high" level.

The enablement signal generation circuit 322 of the drive control circuit 320 may output the read flag signal RDF having a logic "high" level as the pre-enablement signal ODTEN_PRE according to the non-target termination operation signal NTMR having a logic "high" level. The enablement signal generation circuit 322 may inversely buffer the read flag signal RDF to generate the data enablement signal OENDATA having a logic "low" level.

The control signal generation circuit 323 of the drive control circuit 320 may generate the first to fourth pull-up control signals PUD<1:4> from the first and second pre-pull-up control signals PU_PRE<1:2> and may generate the first to fourth pull-down control signals PDD<1:4> from the first and second pre-pull-down control signals PD_PRE<1:2> according to the pre-enablement signal ODTEN_PRE having a logic "high" level.

The drive signal output circuit 420 may generate the first to fourth pull-up drive signals PU1<1:4> from the first to fourth pull-up control signals PUD<1:4> and may generate the first to fourth pull-down drive signals PD1<1:4> from the first to fourth pull-down control signals PDD<1:4>. That is, the first to fourth pull-down drive signals PD1<1:4> may be generated from the first and second pre-pull-down control signals PD_PRE<1:2>.

At a point of time "T33", the driver 500 may generate the data DATA from the first internal data ID1 according to the data enablement signal OENDATA having a logic "low" level.

The first internal termination circuit 22 may drive the I/O line IO with a drivability which is adjusted according to the first to fourth pull-up drive signals PU1<1:4> and the first to fourth pull-down drive signals PD1<1:4>.

The external I/O circuit 11 of the controller 10 may receive the data DATA through the I/O line IO. The controller termination circuit 12 may be turned on to drive the I/O line IO. In such a case, because the I/O line IO is driven by the adjusted drivability which is matched with a resistance value of the I/O line IO, it may be possible to suppress or reduce a reflection phenomenon of the data DATA.

A time period from the point of time "T31" till the point of time "T33" may be set as a read latency period.

If the read operation terminates after a point of time "T34", the I/O line IO is not driven.

A semiconductor system having an aforementioned configuration may selectively drive some of the termination circuits included in a controller and a plurality of semiconductor devices to prevent reflection of I/O signals loaded on I/O lines during a read operation and a write operation. In addition, the semiconductor system may drive the termination circuits included in the semiconductor devices not performing the read operation and the write operation to prevent the reflection of the I/O signals loaded on the I/O lines which are shared by the semiconductor devices. Accordingly, the reliability and performance of the semiconductor system may be improved.

Figure 13:
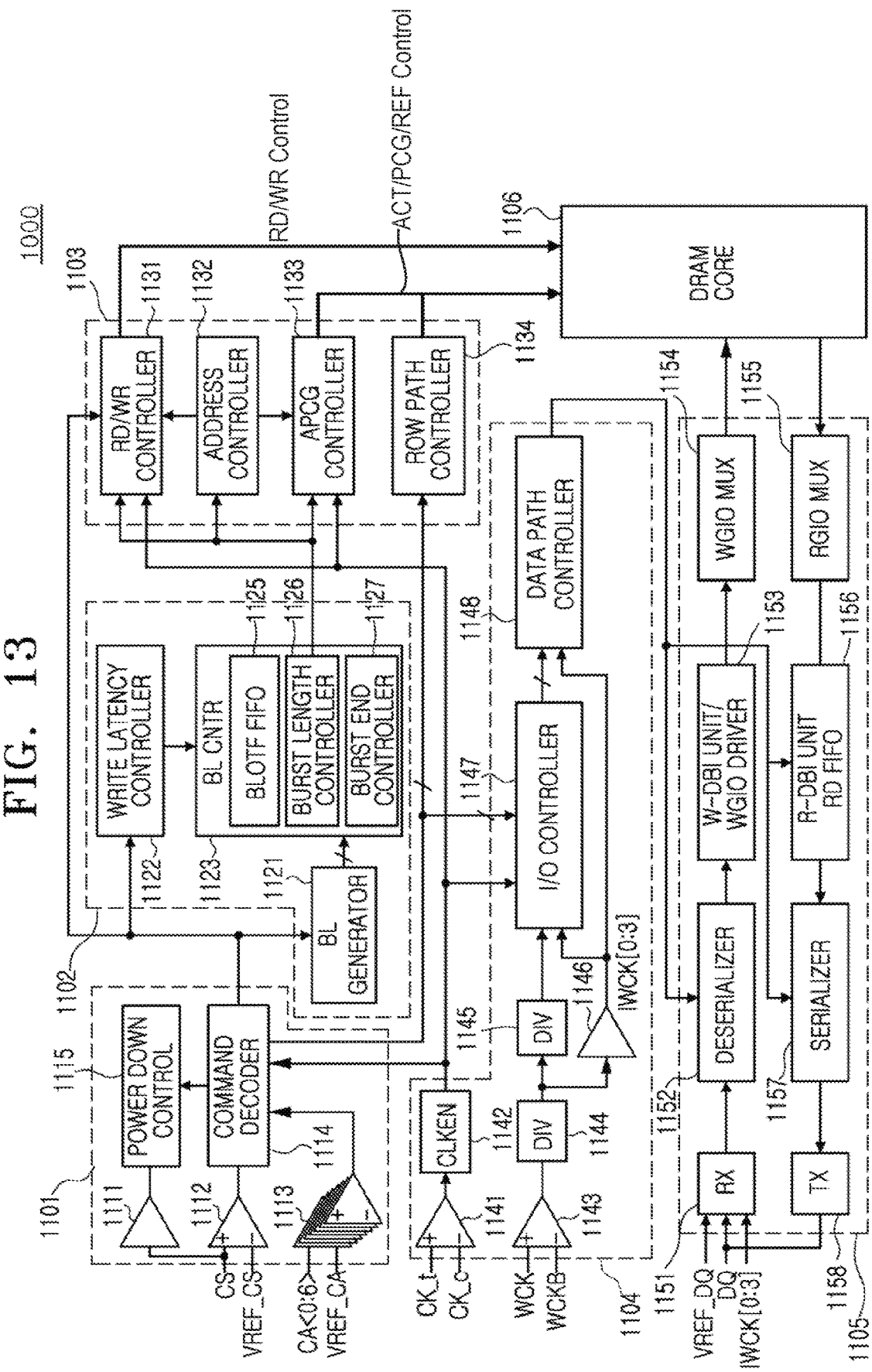
FIG. 13 is a block diagram illustrating a configuration of a semiconductor device employed in a semiconductor system according to an embodiment of the present disclosure.

Referring to FIG. 13, a semiconductor device 1000 according to an embodiment may include a command control circuit 1101, a latency/burst control circuit 1102, an operation control circuit 1103, an input/output (I/O) control circuit 1104, a data I/O circuit 1105 and a DRAM core 1106.

The command control circuit 1101 may include an input drive circuit 1111, a chip selection signal buffer 1112, a command/address buffer 1113, a command decoder 1114 and a power-down control circuit 1115. The input drive circuit 1111 may receive and drive a chip selection signal CS to transmit the chip selection signal CS to the power-down control circuit 1115. The chip selection signal buffer 1112 may buffer the chip selection signal CS based on a chip selection reference voltage VREF_CS. The command/address buffer 1113 may buffer a command/address signal CA<0:6> based on a command/address reference voltage VREF_CA. The command decoder 1114 may decode the command/address signal CA<0:6> buffered by the command/address buffer 1113 based on the chip selection signal CS buffered by the chip selection signal buffer 1112 to generate various commands necessary for the operation of the semiconductor device 1000. The power-down control circuit 1115 may control a power-down mode based on the chip selection signal CS driven by the input drive circuit 1111 and a command generated by the command decoder 1114.

The latency/burst control circuit 1102 may include a burst length information generator 1121, a write latency controller 1122 and a burst length control circuit 1123. The burst length information generator 1121 may generate information necessary for control of a burst length operation based on a command generated by the command decoder 1114. The write latency controller 1122 may perform a control operation according to a write latency based on a command generated by the command decoder 1114. The burst length control circuit 1123 may include an information storage circuit 1125 storing information outputted from the burst length information generator 1121. The burst length control circuit 1123 may include a burst length controller 1126 for controlling the burst length operation based on a command generated by the command decoder 1114, a signal outputted from the write latency controller 1122, and information outputted from the burst length information generator 1121. The burst length control circuit 1123 may include a burst end controller 1127 for controlling a burst end operation based on a command generated by the command decoder 1114, a signal outputted from the write latency controller 1122, and information outputted from the burst length information generator 1121.

The operation control circuit 1103 may include a read/write controller 1131, an address controller 1132, an auto-pre-charge controller 1133 and a row path controller 1134 to generate a read/write control signal RD/WR_Control for controlling a read operation and a write operation as well as a row path control signal ACT/PCG/REF_Control for controlling an active operation, a pre-charge operation and a refresh operation. The read/write controller 1131 may control the read operation and the write operation based on a signal outputted from the latency/burst control circuit 1102 and a signal outputted from the address controller 1132 if clock signals CK_t and CK_c are activated. The address controller 1132 may control generation of an address based on a signal outputted from the latency/burst control circuit 1102. The auto-pre-charge controller 1133 may control an auto-pre-charge operation based on a signal outputted from the latency/burst control circuit 1102 if the clock signals CK_t and CK_c are activated. The row path controller 1134 may control a row path based on a command generated by the command decoder 1114.

The I/O control circuit 1104 may include a first clock buffer 1141, a clock enablement signal generator 1142, a second clock buffer 1143, a first divider 1144, a second divider 1145, an internal clock driver 1146, an I/O controller 1147 and a data path controller 1148. The first clock buffer 1141 may receive and buffer the clock signals CK_t and CK_c. The clock enablement signal generator 1142 may generate a clock enablement signal after the clock signals CK_t and CK_c buffered by the first clock buffer 241 are activated. The second clock buffer 1143 may receive and buffer data clock signals WCK and WCKB for input and output of the data. The first divider 1144 may divide the data clock signals WCK and WCKB buffered by the second clock buffer 1143. The second divider 1145 may receive and divide an output signal of the first divider 1144. The internal clock driver 1146 may receive and divide an output signal of the first divider 1144 to generate an internal data clock signal IWCK[0:3]. The I/O controller 1147 may receive a signal divided by the second divider 1145 and the internal data clock signal IWCK[0:3] generated by the internal clock driver 1146 to control the input and output of the data. The data path controller 1148 may control a data path used in the input and output of the data, based on a signal outputted from the I/O controller 1147 and the internal data clock signal IWCK[0:3] generated by the internal clock driver 1146.

The data I/O circuit 1105 may include a receiver 1151, a deserializer 1152, a write driver 1153, a write multiplexer 1154, a read multiplexer 1155, a read driver 1156, a serializer 1157 and a transmitter 1158. The receiver 1151 may be synchronized with the internal data clock signal IWCK[0:3] to receive transmission data DQ based on a data reference voltage VREF_DQ. The deserializer 1152 may convert the transmission data DQ inputted in series through the receiver 1151 into parallel data. The write driver 1153 may drive the parallel data to transmit the driven parallel data to the write multiplexer 1154. The write multiplexer 1154 may transmit the data driven by the write driver 1153 to the DRAM core 1106 using a multiplexing technique with an I/O line. The read multiplexer 1155 may output the data outputted from the DRAM core 1106 through the I/O line to the read driver 1156 using a multiplexing technique during the read operation. The read driver 1156 may drive the data outputted from the DRAM core 1106 through the read multiplexer 1155 to output the driven data to the serializer 1157. The serializer 1157 may convert the data outputted from the read driver 1156 into serial data. The transmitter 1158 may output the serial data converted by the serializer 1157 as the transmission data DQ.

The DRAM core 1106 may perform the read operation or the write operation for outputting or receiving the data through the data I/O circuit 1105 based on the read/write control signal RD/WR_Control. The DRAM core 1106 may perform the active operation, the pre-charge operation or the refresh operation based on the row path control signal ACT/PCG/REF_Control.

The semiconductor device 1000 illustrated in FIG. 13 may be applied to each of the first semiconductor device 20 and the second semiconductor device 300 included in the semiconductor system 1 according to an embodiment except I/O signals thereof.

What is claimed is:

1. A semiconductor system comprising:
    a controller configured to output a clock signal, a chip selection signal and a command and address (command/address) signal, the controller including a controller termination circuit turned on during a read operation and configured to receive first data through an input/output (I/O) line coupled to the controller termination circuit during the read operation, and the controller configured to output second data through the I/O line coupled to the controller termination circuit turned off during a write operation; and
    a semiconductor device including an internal termination circuit configured to turned off during the read operation, the semiconductor device configured to output the first data through the I/O line coupled to the internal termination circuit based on the chip selection signal and the command/address signal during the read operation, and the semiconductor device configured to store the second data inputted through the I/O line coupled to the internal termination circuit turned on during the write operation.

2. The semiconductor system of claim 1,
    wherein a drivability of the controller termination circuit is adjusted to be matched with a resistance value of the I/O line during the read operation; and
    wherein a drivability of the internal termination circuit is adjusted to be matched with a resistance value of the I/O line during the write operation.

3. The semiconductor system of claim 1, wherein the controller outputs information on a resistance value of the I/O line through the command/address signal during a mode register write operation.

4. The semiconductor system of claim 1, wherein the semiconductor device comprises:
    an internal I/O circuit configured to be synchronized with the clock signal to generate internal data from the second data during the write operation based on the chip selection signal and the command/address signal, to generate the first data from the internal data during the read operation based on the chip selection signal and the command/address signal, and to generate a pull-up drive signal and a pull-down drive signal for adjusting the drivability for driving the I/O line based on the chip selection signal and the command/address signal;
    an internal termination circuit configured to drive the I/O line with the drivability adjusted based on the pull-up drive signal and the pull-down drive signal during the write operation; and
    a memory circuit configured to store the internal data during the write operation and configured to output the stored internal data during the read operation.

5. The semiconductor system of claim 4,
    wherein the internal I/O circuit is configured to store information on a resistance value of the I/O line, which is inputted through the command/address signal, during a mode register write operation; and
    wherein the internal I/O circuit is configured to output the information on the resistance value of the I/O line during a mode register read operation.

6. The semiconductor system of claim 4, wherein the internal I/O circuit comprises:
    an input buffer configured to be synchronized with the clock signal to generate an internal clock signal, configured to be synchronized with the clock signal to generate an internal chip selection signal from the chip selection signal, and configured to be synchronized with the clock signal to generate an internal command/address signal from the command/address signal;
    a pulse generation circuit configured to generate a write flag signal which is enabled during the write operation based on a logic level combination of the internal chip selection signal and the internal command/address signal and configured to generate a read flag signal which is enabled during the read operation based on a logic level combination of the internal chip selection signal and the internal command/address signal;
    an I/O control circuit configured to generate a pull-up control signal and a pull-down control signal from information on a resistance value of the I/O line based on the write flag signal during the write operation and configured to generate a data enablement signal based on the internal command/address signal during the write operation;
    a drive signal generation circuit configured to receive the second data to generate the pull-up drive signal and the pull-down drive signal from the pull-up control signal and the pull-down control signal; and
    a driver configured to generate the first data from the internal data during the read operation and configured to generate the internal data from the second data when the data enablement signal is inputted during the write operation.

7. The semiconductor system of claim 6, wherein the pulse generation circuit comprises:
    a command decoder configured to be synchronized with the internal clock signal to generate a write signal which is enabled when the internal chip selection signal and the internal command/address signal have a logic level combination for performing the write operation and configured to be synchronized with the internal clock signal to generate a read signal which is enabled when the internal chip selection signal and the internal command/address signal have a logic level combination for performing the read operation; and a flag signal generation circuit configured to shift the write signal based on a write latency signal to generate the write flag signal and configured to shift the read signal based on a read latency signal to generate the read flag signal.

8. The semiconductor system of claim 6, wherein the I/O control circuit comprises:
a mode register configured to be synchronized with the internal clock signal to store information on a resistance value of the I/O line, which is inputted through the internal command/address signal, a target termination signal, a write latency signal, a read latency signal and a target termination operation signal based on the internal chip selection signal and the internal command/address signal during a mode register write operation, configured to be synchronized with the internal clock signal to output the resistance value information of the I/O line as a pre-pull-up control signal and a pre-pull-down control signal based on the internal chip selection signal and the internal command/address signal during a mode register read operation, and configured to be synchronized with the internal clock signal to output the stored target termination signal, the stored write latency signal, the stored read latency signal and the stored target termination operation signal based on the internal chip selection signal and the internal command/address signal during the mode register read operation; and
a drive control circuit configured to generate the data enablement signal from the target termination operation signal when the write flag signal is inputted to the drive control circuit and configured to generate the pull-up control signal and the pull-down control signal from the pre-pull-up control signal and the pre-pull-down control signal when the write flag signal is inputted to the drive control circuit.

9. The semiconductor system of claim 8, wherein the drive control circuit comprises:
an on-die termination (ODT) control circuit configured to generate a target write signal which is enabled at a point in time when the write flag signal is inputted to the ODT control circuit while the target termination operation signal is enabled;
an enablement signal generation circuit configured to generate the data enablement signal from the read flag signal during the read operation, configured to output the target write signal as a pre-enablement signal during the write operation, and configured to inversely buffer the target write signal to generate the data enablement signal; and
a control signal generation circuit configured to generate the pull-up control signal from the pre-pull-up control signal and configured to generate the pull-down control signal from the target termination signal or the pre-pull-down control signal based on the pre-enablement signal.

10. The semiconductor system of claim 6, wherein the drive signal generation circuit comprises:
a pull-up/pull-down signal generation circuit configured to generate a pull-up signal and a pull-down signal, one of which is selectively enabled based on a logic level of the second data; and
a drive signal output circuit configured to generate the pull-up drive signal and the pull-down drive signal from the pull-up control signal and the pull-down control signal when the pull-up signal and the pull-down signal are enabled.

11. The semiconductor system of claim 10, wherein the drive signal output circuit comprises:
a pull-up drive signal output circuit configured to output the pull-up control signal as the pull-up drive signal when the pull-up signal is enabled; and
a pull-down drive signal output circuit configured to output the pull-down control signal as the pull-down drive signal when the pull-down signal or the data enablement signal is enabled.

12. A semiconductor system comprising:
a controller configured to output a clock signal, first and second chip selection signals and a command/address signal and configured to include a controller termination circuit which is turned on during a read operation and turned off during a write operation;
a first semiconductor device configured to include a first internal termination circuit which is turned off during the read operation and the write operation based on the first chip selection signal and the command/address signal; and
a second semiconductor device configured to include a second internal termination circuit which is turned on during the read operation and the write operation based on the second chip selection signal and the command/address signal,
wherein the controller termination circuit, the first internal termination circuit and the second internal termination circuit share an input/output (I/O) line with each other to be driven.

13. The semiconductor system of claim 12,
wherein the controller receives first data through the I/O line during the read operation and outputs second data through the I/O line during the write operation; and
wherein the first semiconductor device outputs the first data through the I/O line during the read operation and receives and stores the second data during the write operation.

14. The semiconductor system of claim 12,
wherein a drivability of the controller termination circuit is adjusted to be matched with a resistance value of the I/O line during the read operation; and
wherein a drivability of the first internal termination circuit is adjusted to be matched with a resistance value of the I/O line during the write operation.

15. The semiconductor system of claim 12, wherein the second internal termination circuit is configured to drive the I/O line with a predetermined drivability during the read operation and the write operation.

16. The semiconductor system of claim 12, wherein the first semiconductor device comprises:
a first internal I/O circuit configured to be synchronized with the clock signal to generate first internal data from second data loaded on the I/O line during the write operation based on the first chip selection signal and the command/address signal, to generate first data from the first internal data and to output the first data through the I/O line during the read operation based on the first chip selection signal and the command/address signal, and to generate a first pull-up drive signal and a first pull-down drive signal for adjusting a drivability for driving the I/O line based on the first chip selection signal and the command/address signal;
a first internal termination circuit configured to drive the I/O line with the drivability adjusted based on the first pull-up drive signal and the first pull-down drive signal during the write operation; and a first memory circuit configured to store the first internal data during the write operation and configured to output the stored first internal data during the read operation.

17. The semiconductor system of claim 16,
wherein the first internal I/O circuit is configured to store information on a resistance value of the I/O line, which is inputted through the command/address signal, during a mode register write operation; and
wherein the first internal I/O circuit is configured to output the information on the resistance value of the I/O line during a mode register read operation.

18. The semiconductor system of claim 16, wherein the first internal I/O circuit comprises:
a first input buffer configured to be synchronized with the clock signal to generate a first internal clock signal, configured to be synchronized with the clock signal to generate a first internal chip selection signal from the first chip selection signal, and configured to be synchronized with the clock signal to generate a first internal command/address signal from the command/address signal;
a first pulse generation circuit configured to generate a first write flag signal which is enabled during the write operation based on a logic level combination of the first internal chip selection signal and the first internal command/address signal and configured to generate a first read flag signal which is enabled during the read operation based on a logic level combination of the first internal chip selection signal and the first internal command/address signal;
a first I/O control circuit configured to generate a first pull-up control signal and a first pull-down control signal from information on a resistance value of the I/O line based on the first write flag signal during the write operation and configured to generate a first data enablement signal based on the first internal command/address signal during the write operation;
a first drive signal generation circuit configured to receive the second data to generate the first pull-up drive signal and the first pull-down drive signal from the first pull-up control signal and the first pull-down control signal; and
a first driver configured to generate the first data from the first internal data during the read operation and configured to generate the first internal data from the second data when the first data enablement signal is inputted during the write operation.

19. The semiconductor system of claim 18, wherein the first pulse generation circuit comprises:
a first command decoder configured to be synchronized with the first internal clock signal to generate a first write signal which is enabled when the first internal chip selection signal and the first internal command/address signal have a logic level combination for performing the write operation and configured to be synchronized with the first internal clock signal to generate a first read signal which is enabled when the first internal chip selection signal and the first internal command/address signal have a logic level combination for performing the read operation; and
a first flag signal generation circuit configured to shift the first write signal based on a first write latency signal to generate the first write flag signal and configured to shift the first read signal based on a first read latency signal to generate the first read flag signal.

20. The semiconductor system of claim 18, wherein the first I/O control circuit comprises:
a first mode register configured to be synchronized with the first internal clock signal to store information on a resistance value of the I/O line, which is inputted through the first internal command/address signal, a first target termination signal, a first write latency signal, a first read latency signal, a target termination operation signal and a non-target termination operation signal based on the first internal chip selection signal and the first internal command/address signal during a mode register write operation, configured to be synchronized with the first internal clock signal to output the resistance value information of the I/O line as a first pre-pull-up control signal and a first pre-pull-down control signal based on the first internal chip selection signal and the first internal command/address signal during a mode register read operation, and configured to be synchronized with the first internal clock signal to output the stored first target termination signal, the stored first write latency signal, the stored first read latency signal, the stored target termination operation signal and the stored non-target termination operation signal based on the first internal chip selection signal and the first internal command/address signal during the mode register read operation; and
a first drive control circuit configured to generate the first data enablement signal from the target termination operation signal and the non-target termination operation signal when the first write flag signal is inputted to the first drive control circuit and configured to generate the first pull-up control signal and the first pull-down control signal from the first pre-pull-up control signal and the first pre-pull-down control signal when the first write flag signal is inputted to the first drive control circuit.

21. The semiconductor system of claim 20, wherein the first drive control circuit comprises:
a first on-die termination (ODT) control circuit configured to generate a first target write signal and a first non-target write signal which are enabled at a point in time when the first write flag signal is inputted to the first ODT control circuit based on the target termination operation signal and the non-target termination operation signal;
a first enablement signal generation circuit configured to generate the first data enablement signal from the first read flag signal during the read operation, configured to output the first target write signal as a first pre-enablement signal during the write operation, and configured to inversely buffer the first target write signal to generate the first data enablement signal; and
a first control signal generation circuit configured to generate the first pull-up control signal from the first pre-pull-up control signal and configured to generate the first pull-down control signal from the first target termination signal or the first pre-pull-down control signal based on the first pre-enablement signal.

22. The semiconductor system of claim 18, wherein the first drive signal generation circuit comprises:
a first pull-up/pull-down signal generation circuit configured to generate a first pull-up signal and a first pull-down signal, one of which is selectively enabled based on a logic level of the second data; and
a first drive signal output circuit configured to generate the first pull-up drive signal and the first pull-down drive signal from the first pull-up control signal and the first pull-down control signal based on the first pull-up signal, the first pull-down signal and the first data enablement signal.

23. The semiconductor system of claim 12, wherein the second semiconductor device comprises:
   a second internal I/O circuit configured to be synchronized with the clock signal to generate a second pull-up signal and a second pull-down signal for driving the I/O line with a predetermined drivability based on the second chip selection signal and the command/address signal during the read operation and the write operation; and
   a second internal termination circuit configured to drive the I/O line with a drivability adjusted based on the second pull-up drive signal and the second pull-down drive signal during the read operation and the write operation.

24. The semiconductor system of claim 23,
   wherein the second internal I/O circuit is configured to store information for driving the I/O line with the predetermined drivability during a mode register write operation; and
   wherein the second internal I/O circuit is configured to output the information for driving the I/O line with the predetermined drivability during a mode register read operation.

25. The semiconductor system of claim 23, wherein the second internal I/O circuit comprises:
   a second input buffer configured to be synchronized with the clock signal to generate a second internal clock signal, configured to be synchronized with the clock signal to generate a second internal chip selection signal from the second chip selection signal, and configured to be synchronized with the clock signal to generate a second internal command/address signal from the command/address signal;
   a second pulse generation circuit configured to generate a second write flag signal which is enabled during the write operation based on a logic level combination of the second internal chip selection signal and the second internal command/address signal and configured to generate a second read flag signal which is enabled during the read operation based on a logic level combination of the second internal chip selection signal and the second internal command/address signal;
   a second I/O control circuit configured to generate a second pull-up control signal and a second pull-down control signal from information for driving the I/O line with the predetermined drivability based on the second write flag signal during the write operation and configured to generate a second data enablement signal based on the second internal command/address signal during the write operation;
   a second drive signal generation circuit configured to generate the second pull-up drive signal and the second pull-down drive signal from the second pull-up control signal and the second pull-down control signal; and
   a second driver configured to generate the second internal data from the second data when the second data enablement signal is inputted to the second driver.

26. The semiconductor system of claim 25, wherein the second pulse generation circuit comprises:
   a second command decoder configured to be synchronized with the second internal clock signal to generate a second write signal which is enabled when the second internal chip selection signal and the second internal command/address signal have a logic level combination for performing the write operation and configured to be synchronized with the second internal clock signal to generate a second read signal which is enabled when the second internal chip selection signal and the second internal command/address signal have a logic level combination for performing the read operation; and
   a second flag signal generation circuit configured to shift the second write signal based on a second write latency signal to generate the second write flag signal and configured to shift the second read signal based on a second read latency signal to generate the second read flag signal.

27. The semiconductor system of claim 25, wherein the second I/O control circuit comprises:
   a second mode register configured to be synchronized with the second internal clock signal to store information for driving the I/O line with the predetermined drivability, which is inputted through the second internal command/address signal, a non-target termination signal, a second write latency signal, a second read latency signal, a target termination operation signal and a non-target termination operation signal based on the second internal chip selection signal and the second internal command/address signal during a mode register write operation, configured to be synchronized with the second internal clock signal to output the information for driving the I/O line with the predetermined drivability as a second pre-pull-up control signal and a second pre-pull-down control signal based on the second internal chip selection signal and the second internal command/address signal during a mode register read operation, and configured to be synchronized with the second internal clock signal to output the stored non-target termination signal, the stored second write latency signal, the stored second read latency signal and the stored target termination operation signal based on the second internal chip selection signal and the second internal command/address signal during the mode register read operation; and
   a second drive control circuit configured to generate the second data enablement signal based on the non-target termination operation signal when the second write flag signal is inputted to the second drive control circuit and configured to generate the second pull-up control signal and the second pull-down control signal from the second pre-pull-up control signal and the second pre-pull-down control signal.

28. The semiconductor system of claim 27, wherein the second drive control circuit comprises:
   a second on-die termination (ODT) control circuit configured to generate a second target write signal and a second non-target write signal which are enabled at a point in time when the second write flag signal is inputted to the second ODT control circuit based on the target termination operation signal and the non-target termination operation signal;
   a second enablement signal generation circuit configured to output the second target write signal as a second pre-enablement signal and configured to inversely buffer the second target write signal to generate the second data enablement signal; and
   a second control signal generation circuit configured to generate the second pull-up control signal from the second pre-pull-up control signal and configured to output the non-target termination signal as the second pull-down control signal based on the second pre-enablement signal.

29. The semiconductor system of claim 25, wherein the second drive signal generation circuit comprises:
 a second pull-up/pull-down signal generation circuit configured to generate a second pull-up signal and a second pull-down signal, one of which is selectively enabled based on a logic level of the second data; and
 a second drive signal output circuit configured to generate the second pull-up drive signal and the second pull-down drive signal from the second pull-up control signal and the second pull-down control signal based on the second pull-up signal, the second pull-down signal and the second data enablement signal.

* * * * *